(12) United States Patent
Haratani et al.

(10) Patent No.: US 8,593,134 B2
(45) Date of Patent: Nov. 26, 2013

(54) CURRENT SENSOR

(75) Inventors: Susumu Haratani, Tokyo (JP); Hitoshi Yamaguchi, Tokyo (JP); Masahiro Miyazaki, Tokyo (JP); Shigeru Shimura, Tokyo (JP)

(73) Assignee: TDK Corporation, Tokyo (JP)

(*) Notice: Subject to any disclaimer, the term of this patent is extended or adjusted under 35 U.S.C. 154(b) by 296 days.

(21) Appl. No.: 13/042,833

(22) Filed: Mar. 8, 2011

(65) Prior Publication Data

US 2011/0227560 A1 Sep. 22, 2011

(30) Foreign Application Priority Data

Mar. 18, 2010 (JP) ................. 2010-063161

(51) Int. Cl.
*G01R 15/20* (2006.01)

(52) U.S. Cl.
USPC ............. 324/117 R; 324/126; 324/207.21

(58) Field of Classification Search
USPC ............ 324/117 R, 126, 228, 251, 252, 260; 338/32 R; 360/322, 324, 324.1
See application file for complete search history.

(56) References Cited

U.S. PATENT DOCUMENTS

| | | | |
|---|---|---|---|
| 5,561,366 A | 10/1996 | Takahashi et al. | |
| 5,621,377 A | 4/1997 | Dettmann et al. | |
| 5,933,003 A | 8/1999 | Hebing et al. | |
| 7,394,240 B2 | 7/2008 | Shoji | |
| 7,646,196 B2 | 1/2010 | Shoji | |
| 2006/0091993 A1* | 5/2006 | Shoji | 338/32 R |
| 2006/0126230 A1* | 6/2006 | Yuasa et al. | 360/322 |
| 2007/0230065 A1* | 10/2007 | Yuasa et al. | 360/324 |
| 2008/0309329 A1* | 12/2008 | Kahlman et al. | 324/228 |
| 2008/0316655 A1* | 12/2008 | Shoji | 360/324.1 |

FOREIGN PATENT DOCUMENTS

| | | |
|---|---|---|
| JP | A-5-126865 | 5/1993 |
| JP | A-2009-2911 | 1/2009 |
| JP | B2-4360998 | 11/2009 |

OTHER PUBLICATIONS

Japanese Office Action dated Jan. 31, 2012 issued in Japanese Patent Application No. 2010-063161 (with translation).

* cited by examiner

*Primary Examiner* — Minh N Tang
(74) *Attorney, Agent, or Firm* — Oliff & Berridge, PLC

(57) ABSTRACT

A current sensor includes first to fourth magneto-resistive elements each having a resistance value; and a compensation current line applying a compensation magnetic field to the magneto-resistive elements. A bridge circuit is formed by the magneto-resistive elements. Resistance values of the first and third magneto-resistive elements change together in one increasing/decreasing direction. Resistance values of the second and fourth magneto-resistive elements change together in the other increasing/decreasing direction. The compensation current is generated by a potential difference between the first and second junctions in response to application of voltage between the third and fourth junctions. The compensation current line includes first to fourth line portions. Each line portion extends in the same direction as the extending direction of the magneto-resistive elements, overlaps the corresponding magneto-resistive elements, and. The current-to-be-detected is detected based on the compensation current.

12 Claims, 20 Drawing Sheets

CURRENT SENSOR

BACKGROUND OF THE INVENTION

1. Field of the Invention

The invention relates to a small current sensor capable of detecting a change of a current flowing through a conductor with high precision.

2. Description of Related Art

Generally, as a method of measuring a control current for controlling a control device or the like, there is used a method of indirectly measuring the control current by detecting a gradient of a current magnetic field generated by the control current. Specifically, for example, four magneto-resistive elements such as giant magneto-resistive elements (hereinafter, referred to as GMR elements) exhibiting giant magneto-resistive effect are used to form a Wheatstone bridge, the Wheatstone bridge is arranged in the current magnetic field, and the gradient thereof is detected (for example, see U.S. Pat. No. 5,621,377).

As described above, by forming a Wheatstone bridge, influence of external noise (an interference magnetic field) or environmental temperature may be suppressed at relatively low level. Particularly, in the case where the characteristics of the four magneto-resistive elements are uniform, more stable detection property is obtainable.

In addition, there has been disclosed an example in which a change of an output voltage caused by environmental temperature or external noise is further reduced by providing a compensation current line (for example, see U.S. Pat. No. 5,933,003).

Further, in the view of increasing requirements for detecting a weaker current, a magneto-resistive element with high impedance and higher sensitivity is demanded. However, in the case where a Wheatstone bridge is configured by using a magneto-resistive element with high impedance and high sensitivity, a large offset output is likely to be generated or large variation in connection resistance is likely to occur. Therefore, it is difficult to adjust balance between four magneto-resistive elements configuring the Wheatstone bridge. Thus, the applicants have previously proposed a current sensor capable of detecting a current magnetic field of a current-to-be-detected with high sensitivity and high precision while adjustment of an offset voltage in a zero magnetic field is easily preformed (for example, see Japanese Patent No. 4360998).

SUMMARY OF THE INVENTION

The applicants disclose, in Japanese Patent No. 4360998, a technique for measuring a current-to-be-detected at high precision by using a compensation current corresponding to a difference of voltage drop between a plurality of magneto-resistive elements.

However, such a current sensor is recently desired to realize both a decrease in size and high performance.

It is desirable to provide a current sensor capable of detecting a current-to-be-detected over wider range with high sensitivity and high precision.

A first current sensor according to an embodiment of the invention includes: first to fourth magneto-resistive elements extending together in one direction along a conductor and configuring a bridge circuit, the first and third magneto-resistive elements having resistance values which change together in one increasing/decreasing direction in response to the induced magnetic field generated by a current-to-be-detected flowing in the conductor, whereas the second and fourth magneto-resistive elements having resistance values which change together in other increasing/decreasing direction in response to the induced magnetic field, the bridge circuit being so configured that one end of the first magneto-resistive element is connected to one end of the second magneto-resistive element at a first junction, one end of the third magneto-resistive element is connected to one end of the fourth magneto-resistive element at a second junction, other end of the first magneto-resistive element is connected to other end of the fourth magneto-resistive element at a third junction, and other end of the second magneto-resistive element is connected to other end of the third magneto-resistive element at a fourth junction. The first current sensor further includes a compensation current line including one or more first line portions corresponding to the first magneto-resistive element, one or more second line portions corresponding to the second magneto-resistive element, one or more third line portions corresponding to the third magneto-resistive element, and one or more fourth line portions corresponding to the fourth magneto-resistive element, each line portion having a width smaller than that of corresponding one of the first to fourth magneto-resistive elements and extending in a direction same as the extending direction of the first to fourth magneto-resistive elements to overlap corresponding one of the first to fourth magneto-resistive elements, the compensation current line allowing a compensation current, which is generated in accordance with a potential difference between the first and second junctions in response to application of voltage between the third and fourth junctions, to flow therein to generate a compensation magnetic field which is directed, at each of the first to fourth magneto-resistive elements, to a direction opposite to that of the induced magnetic field and is applied to the first to fourth magneto-resistive elements. The current-to-be-detected is detected based on the compensation current.

A second current sensor according to an embodiment of the invention includes: first and second magneto-resistive elements each extending along a conductor, and each having resistance values which change in directions opposite from each other in response to an induced magnetic field generated by a current-to-be-detected flowing in the conductor; and a compensation current line including one or more first line portions corresponding to the first magneto-resistive element, one or more second line portions corresponding to the second magneto-resistive element, each line portion having a width smaller than that of corresponding one of the first and second magneto-resistive elements and extending in a direction same as the extending direction of the first and second magneto-resistive elements to overlap corresponding one of the first and second magneto-resistive elements, the compensation current line allowing a compensation current, which is generated in accordance with a difference between a voltage drop generated in the first magneto-resistive element and a voltage drop generated in the second magneto-resistive element by a supply of a read current, to flow therein to generate a compensation magnetic field which is directed, at each of the first and second magneto-resistive elements, to a direction opposite to that of the induced magnetic field and is applied to the first and second magneto-resistive elements. The current-to-be-detected is detected based on the compensation current.

According to the first current sensor and the second current sensor, based on the compensation current generated by a potential difference between the first junction and the second junction in response to application of voltage between the third and fourth junction, or based on the compensation current depending on a difference between voltage drops generated in the magneto-resistive elements, a compensation current is provided for applying, to the magneto-resistive elements, the compensation magnetic field in a direction opposite to the induced magnetic field. Therefore, a variation in the characteristics between the magneto-resistive elements or variation in the connection resistance, or change in an output voltage caused by a temperature distribution is canceled. In addition, each the line portions of the compensation current line overlaps each of the magneto-resistive elements in the thickness direction, and has a width smaller than that of the magneto-resistive element. Therefore the maximum intensity and the average intensity of the effective magnetic field out of the compensation magnetic field, which are actually applied to the magneto-resistive elements, are improved and the resistance change amount of the magneto-resistive elements to the constant change amount of the compensation current is increased.

In the first and the second current sensors, the intensity of the compensation magnetic field is preferably equal to or larger than a threshold value which allows a magnetization of the free layer included in each of the first to fourth magneto-resistive elements (the first and the second magneto-resistive elements) to rotate, and less than a saturation magnetic field of the free layer. This is because the compensation magnetic field may be applied more effectively to the magneto-resistive elements.

In the first and the second current sensors, a plurality of the first to fourth line portions (the first and the second line portions) of the compensation current line are preferably provided. This is because the compensation magnetic field with uniform intensity may be effectively applied to the magneto-resistive elements in the width direction. In this case, a pair of each of the first to fourth line portions (a pair of the first line portions and a pair of the second line portions) is provided so as to sandwich the first to fourth magneto-resistive elements in the thickness direction, respectively. Particularly, a pair of each of the line portions is preferably provided on respective sides of the corresponding magneto-resistive element so that the centers of the line portions sandwich the center of the corresponding magneto-resistive element. This is because larger compensation magnetic field may be applied without deteriorating the homogeneity.

In the second current sensor according to an embodiment of the invention, first and second constant current sources are preferably provided, which supply a same constant current as a read current to the first and the second magneto-resistive elements. In this case, one end of the first magneto-resistive element is connected to one end of the second magneto-resistive element at the first junction, one end of the first constant current source is connected to one end of the second constant current source at the second junction, other end of the first magneto-resistive element is connected to other end of the first constant current source at the third junction, other end of the second magneto-resistive element is connected to other end of the second constant current source at the fourth junction, and the current-to-be-detected is detected based on a potential difference between the third and fourth junction in response to application of voltage between the first and second junction.

In the first and second current sensors, each of the first to fourth magneto-resistive elements preferably has a stacked structure including a pinned layer which has a magnetization direction pinned in a certain direction, an intermediate layer, and a free layer which has a magnetization direction changed depending on an external magnetic field. In this case, the magnetization direction of the pinned layer is preferably a direction orthogonal to an extending direction of the conductor and the line portions of the compensation current line.

Further, one or more bias application members may be provided for applying a bias magnetic field to the stacked structure in a direction orthogonal to the magnetization direction of the pinned layer.

In the first and second current sensors, yokes are preferably provided with a distance from the first to fourth magneto-resistive elements (the first and the second magneto-resistive elements) and along the extending direction of the magneto-resistive elements because the induced magnetic field and the compensation magnetic field are more effectively applied to the magneto-resistive elements.

According to the first and the second current sensors of the embodiments of the invention, since the compensation current line is provided and the width of each of the line portions overlapping each of the magneto-resistive elements is smaller than that of the magneto-resistive elements, the compensation magnetic field with necessary and sufficient intensity may be applied to the magneto-resistive elements. Therefore, for example, variations in characteristics between the plurality of magneto-resistive elements, variation of the connection resistance in the circuit, or a change in an output voltage caused by a temperature distribution may be canceled. Accordingly, the induced magnetic field may be detected with higher sensitivity and higher precision, and thus the current-to-be-detected is determined more accurately. Moreover, the detectable range of the current-to-be-detected is expanded. In other words, the current-to-be-detected may be detected over wider range without increasing the compensation current.

Other and further objects, features and advantages of the invention will appear more fully from the following description.

DETAILED DESCRIPTION OF THE PREFERRED EMBODIMENTS

Hereinafter, preferred embodiments of the invention will be described in detail with reference to drawings.

First Embodiment

Figure 1:
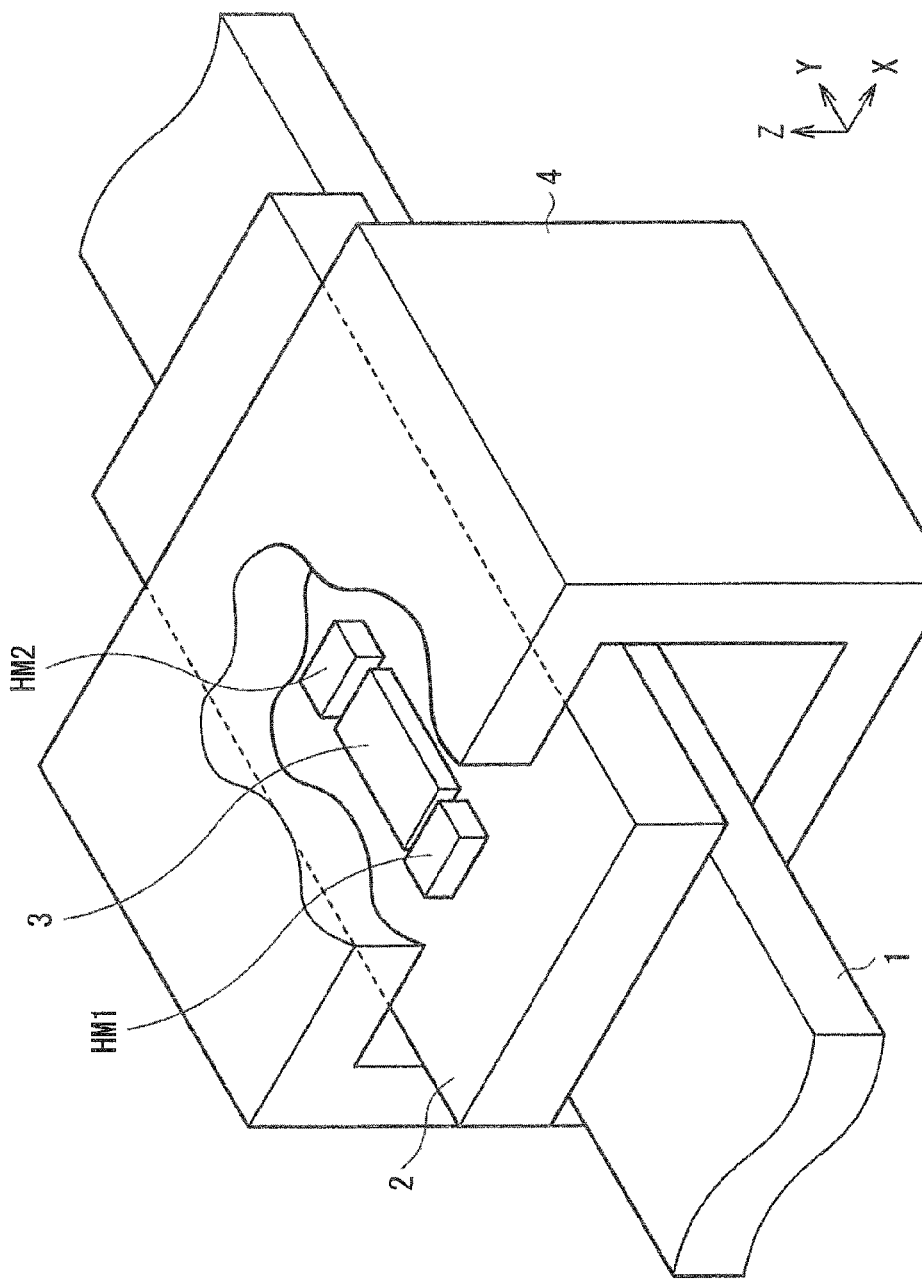
FIG. 1 is a perspective view illustrating a whole configuration of a current sensor according to a first embodiment of the invention.
Figure 2:
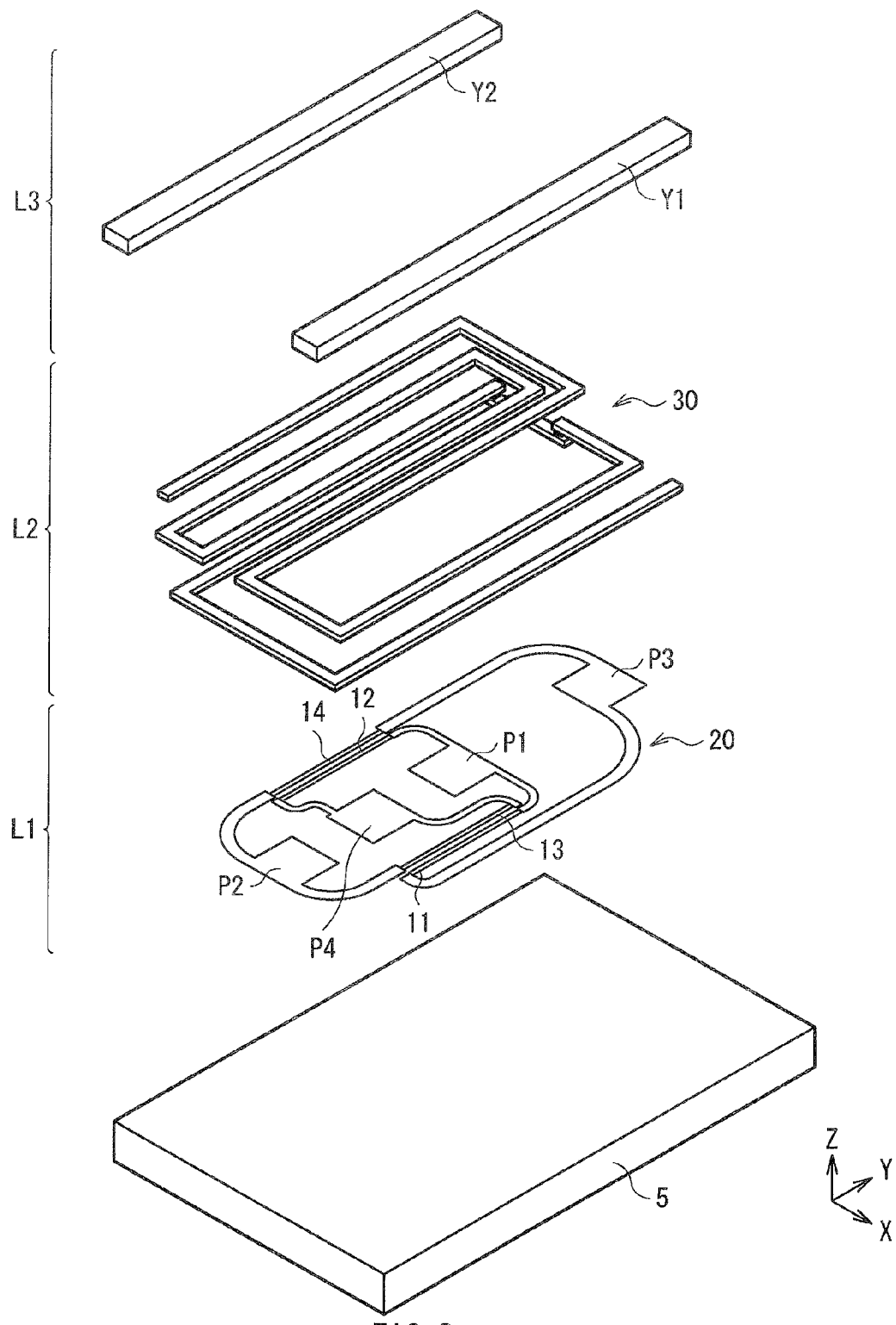
FIG. 2 is an exploded perspective view illustrating a configuration of a main part of a sensor unit illustrated in FIG. 1.
Figure 3:
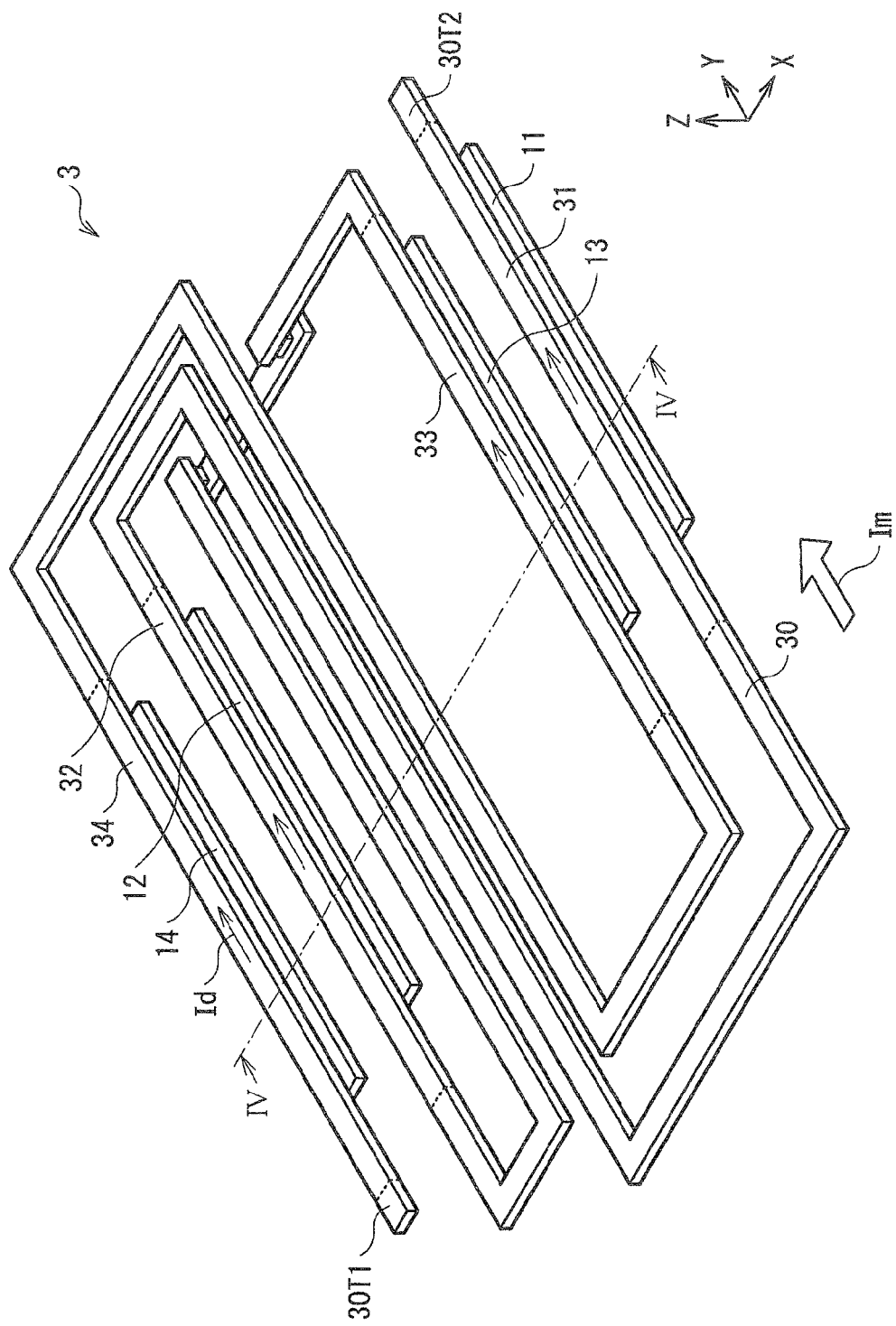
FIG. 3 is an enlarged perspective view illustrating a compensation current line and GMR elements illustrated in FIG. 2.
Figure 4:
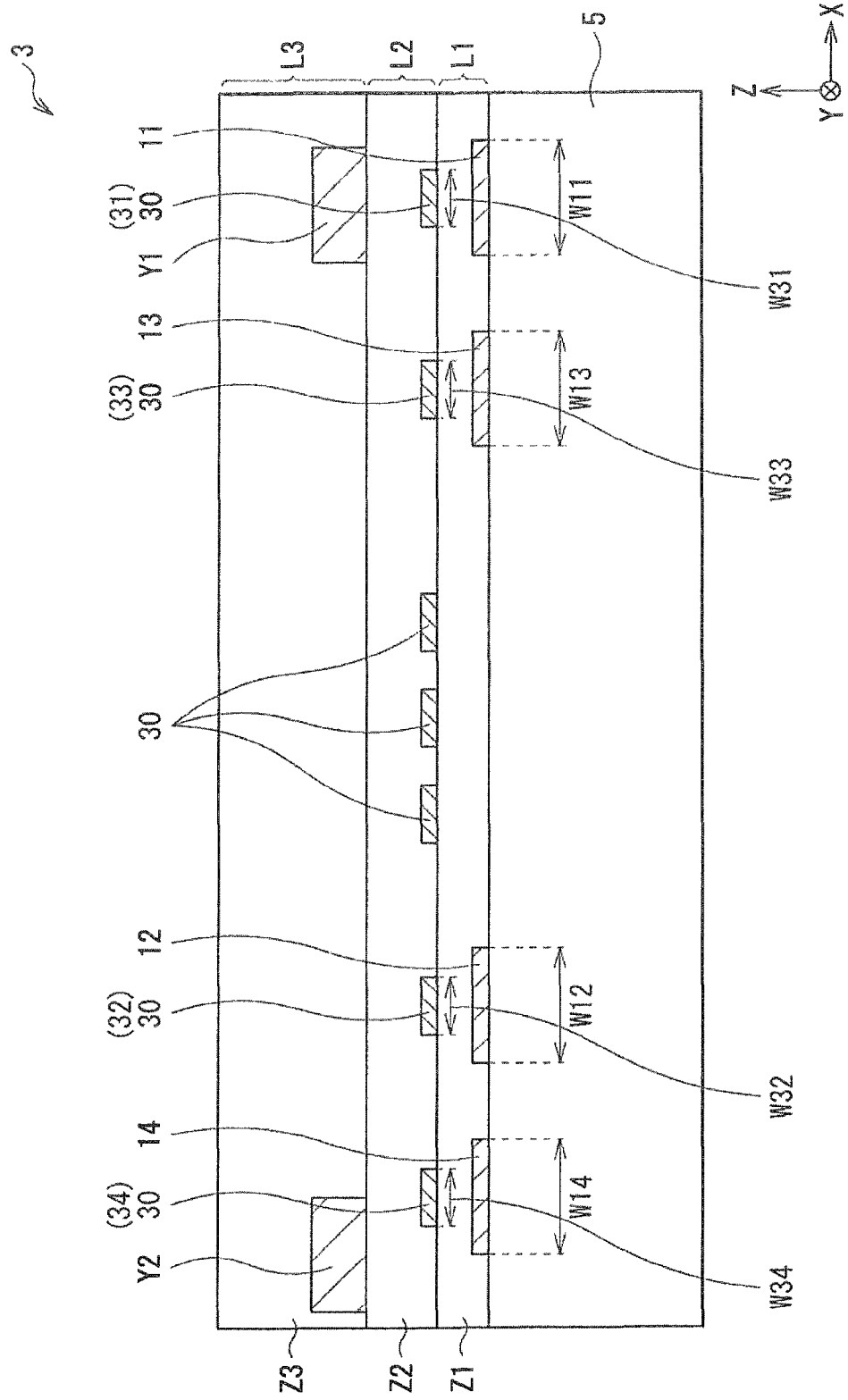
FIG. 4 is a sectional view illustrating a configuration of the sensor unit illustrated in FIG. 3, taken along a IV-IV line.

First, there is described a configuration of a current sensor as a first embodiment of the invention referring to FIG. 1 to FIG. 4. FIG. 1 is a perspective view illustrating a whole configuration of the current sensor according to the embodiment. FIG. 2 is an exploded perspective view illustrating a configuration of a sensor unit 3 which is a main part of the current sensor. FIG. 3 is a perspective view illustrating a detailed configuration of a compensation current line 30 of the sensor unit 3. Further, FIG. 4 is a sectional view of the sensor unit 3 taken along a IV-IV line of FIG. 3.

As illustrated in FIG. 1, the current sensor includes a straight conductor 1 through which a current-to-be-detected Im (described later) flows, a substrate 2 disposed in the vicinity of the conductor 1, and the sensor unit 3 disposed on the substrate 2. On the substrate 2, a pair of permanent magnets HM1 and HM2 is mounted so as to sandwich the sensor unit 3 along an extending direction (here, in Y-axis direction) of the conductor 1. Further, a tubular shield structure 4 made of a magnetic material such as a permalloy is provided to surround the conductor 1 and the sensor unit 3 collectively. The conductor 1 is made of a metal material with high conductivity such as copper (Cu), and generates an induced magnetic field Hm (described later) therearound when the current-to-be-detected Im flows. The shield structure 4 functions to prevent the sensor unit 3 from being applied with an unnecessary external magnetic field.

As illustrated in FIG. 2 to FIG. 4, the sensor unit 3 is formed by stacking in order, for example, on an element substrate 5 (not illustrated in FIG. 3), a first layer L1 provided with a detection circuit 20 (described later) including first to fourth giant magneto-resistive elements 11 to 14 (hereinafter, simply referred to as GMR elements 11 to 14), a second layer L2 including the compensation current line 30, and a third layer L3 (not illustrated in FIG. 3) including yokes Y1 and Y2. As illustrated in FIG. 4, the GMR elements 11 to 14 (in the detection circuit 20), the compensation current line 30, and the yokes Y1 and Y2 are respectively buried in insulating films Z1, Z2, and Z3 made of aluminum oxide ($Al_2O_3$) or the like, and insulated with one another.

The element substrate 5 is made of a silicon (Si) compound such as glass and silicon oxide ($SiO_2$), or an insulating material such as $Al_2O_3$.

The compensation current line 30 is made of a metal material with high conductivity such as copper, and is a thin film conducting wire in which a thin film is extended in a stacking plane. For example, a compensation current Id provided from the detection circuit 20 flows into the compensation current line 30 from one end 30T1. A part of the compensation current line 30 extends straight in an extending direction (here, in Y-axis direction) of the conductor 1, and includes a plurality of line portions 31 to 34 arranged parallel to each other in a width direction (in X-axis direction) orthogonal to the extending direction and the thickness direction (the stacking direction). The line portions 31 to 34 have widths W31 to W34 in the width direction, respectively. The widths W31 to W34 may be equal to each other, or may be different from each other. Note that the shape (layout) of the compensation current line 30 is not limited to that illustrated in FIG. 2 and FIG. 3.

The detection circuit 20 is a bridge circuit in which the four GMR elements 11 to 14 are bridge-connected. The GMR elements 11 to 14 are strip-shaped thin film patterns arranged along the conductor 1, and each have a resistance value which changes depending on an induced magnetic field Hm (described later) generated by a current-to-be-detected Im (described later) which flows through the conductor 1. Specifically, the resistance values of the GMR elements 11 and 13 change (increase or decrease) in the same direction depending on the induced magnetic field Hm. On the other hand, the resistance values of the GMR elements 12 and 14 change (decrease or increase), depending on the induced magnetic field Hm, in the opposite direction to that of (the change of the resistance value of) the GMR elements 11 and 13. In other words, for example, in the case where the resistance values of the GMR elements 11 and 13 increase, the resistance values of the GMR elements 12 and 14 decrease.

The GMR elements 11 to 14 extend in the same direction (in this case, in Y-axis direction). The GMR elements 11 to 14 have widths W11 to W14 in the direction orthogonal to the extending direction and the thickness direction (stacking direction), respectively. The widths W11 to W14 may be equal to each other, or may be different from each other. Here, the GMR elements 11 to 14 have one-to-one relationship with the line portions 31 to 34 of the compensation current line 30, respectively. In other words, as illustrated in FIG. 3 and FIG. 4, in the stacking direction (in Z-axis direction), the GMR element 11 is placed to overlap the line portion 31, the GMR element 12 is placed to overlap the line portion 32, the GMR element 13 is placed to overlap the line portion 33, and the GMR element 14 is placed to overlap the line portion 34. With the positional relationship of overlapping the GMR elements 11 to 14 with the line portions 31 to 34 of the compensation current line 30 in the thickness direction, the GMR elements 11 to 14 are affected by the compensation magnetic field Hd (Hd1 to Hd4) from the line portions 31 to 34, in addition to the induced magnetic field Hm. Here, the GMR elements 11 to 14 and the line portions 31 to 34 of the compensation current line 30 have such a positional relationship that all projections (orthogonal projections) of the line portion 31 to 34 in the thickness direction are included in the GMR elements 11 to 14 without protruding in the in-plane direction. Therefore, the widths W31 to W34 are narrower than the widths W11 to W14, respectively. The detailed configuration of the GMR elements 11 to 14 will be described later.

The yokes Y1 and Y2 mainly have function to guide the induced magnetic field Hm generated around the conductor 1 toward the GMR elements 11 to 14. The yokes Y1 and Y2 are preferably made of a soft magnetic material having high magnetic permeability such as permalloy (NiFe), cobalt iron nickel (CoFeNi) alloy, iron silicon alloy (FeSi), sendust, nickel-zinc (NiZn) ferrite, and manganese-zinc (MnZn) ferrite.

The permanent magnets HM1 and HM2 function to reduce hysteresis by application of a bias magnetic field to a free layer 63 (described later) of each of the GMR elements 11 to 14.

Circuit Configuration of Current Sensor

Next, the circuit configuration of the current sensor will be described referring to FIG. 3 and FIG. 5.

Figure 5:
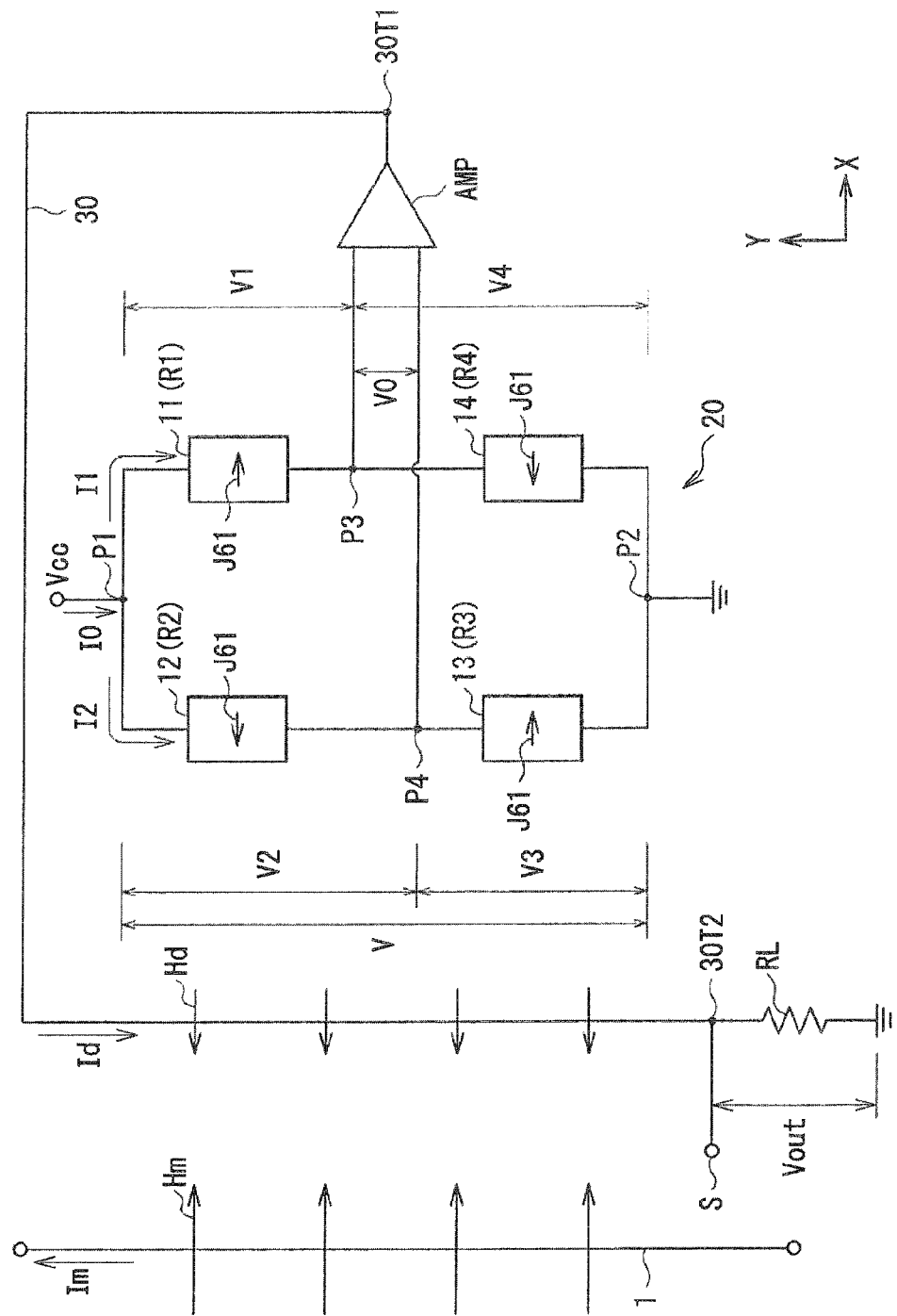
FIG. 5 is a circuit diagram of the current sensor illustrated in FIG. 1.

As illustrated in FIG. 3 and FIG. 5, the detection circuit 20 includes junctions P1 to P4. The junction P1 connects one end of the GMR element 11 and one end of the GMR element 12, the junction P2 connects one end of the GMR element 13 and one end of the GMR element 14, the junction P3 connects other end of the GMR element 11 and other end of the GMR element 14, and the junction P4 connects other end of the GMR element 12 and other end of the GMR element 13. Each of the junctions P1 to P4 is a thin film pattern made of a non-magnetic material having high conductivity such as copper. In addition, the junction P1 is connected to a power source Vcc, and the junction P2 is grounded. Further, the junctions P3 and P4 are connected to an input of a differential amplifier AMP (illustrated in FIG. 5).

Figure 6:
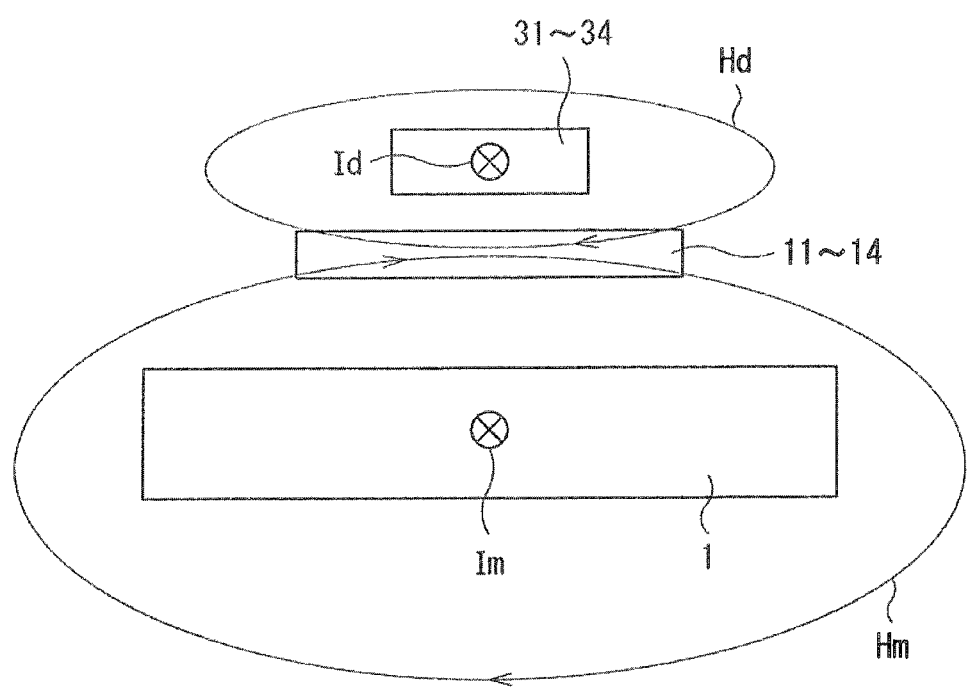
FIG. 6 is a schematic diagram for explaining directions of an induced magnetic field and a compensation magnetic field which are applied to the GMR elements in the current sensor illustrated in FIG. 1.

One end 30T1 of the compensation current line 30 is connected to an output of the differential amplifier AMP through a not-illustrated wiring, and other end 30T2 is grounded through a resistor RL. The end 30T2 on the differential amplifier AMP side of the resistor RL is connected to a compensation current detection section S. Therefore, the compensation current line 30 is supplied with the compensation current Id based on a potential difference between the junction P3 and the junction P4 in response to application of voltage between the junction P1 and the junction P2. The compensation current line 30 has a path for applying the compensation magnetic field Hd to the GMR elements 11 to 14 at the time of flowing the compensation current Id. Here, the direction of the compensation magnetic field Hd generated in the line portions 31 to 34 is opposite to that of the induced magnetic field Hm generated by the current-to-be-detected Im flowing through the conductor 1. In other words, as illustrated by arrows in FIG. 5 and FIG. 6, when the induced magnetic field Hm is applied to the GMR elements 11 to 14 in +X-direction, for example, the compensation magnetic field Hd is applied in −X-direction. Note that FIG. 6 is a schematic sectional view illustrating a section surface of the current sensor parallel to the XZ-plane, and illustrating the relationship between the flowing direction of the compensation current Id and the current-to-be-detected Im and the direction of the compensation magnetic field Hd applied to the GMR elements 11 to 14 and the induced magnetic field Hm.

Configuration of GMR Element

Figure 7A:
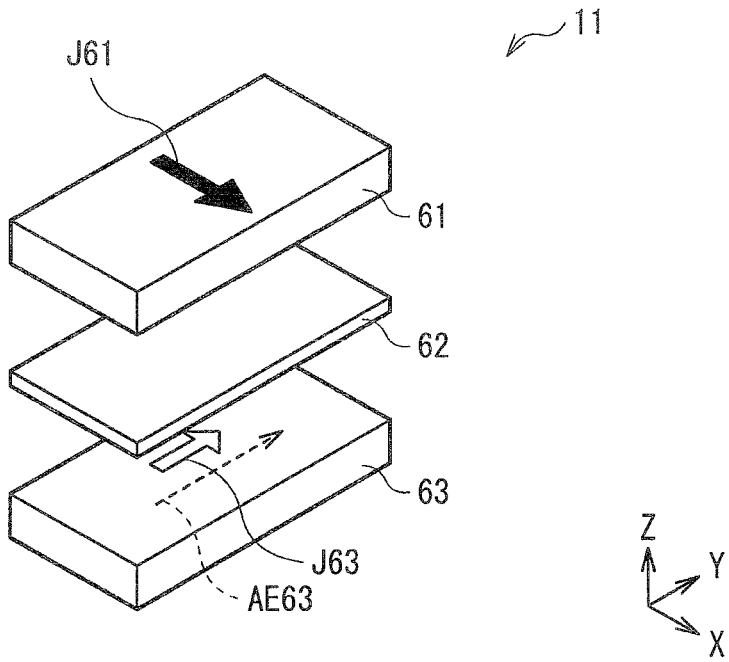
FIGS. 7A and 7B are exploded perspective views illustrating a detailed configuration of the GMR element illustrated in FIG. 2.
Figure 7B:
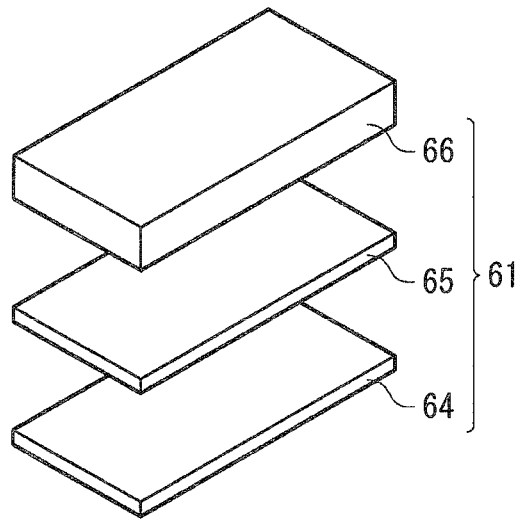

The configuration of the GMR elements 11 to 14 is described in detail referring to FIGS. 7A and 7B. FIGS. 7A and 7B are exploded perspective views illustrating the disassembled configuration of the GMR element 11. Since the GMR elements 11 to 14 have the same configuration except for a direction of a magnetization J61 (described later), the GMR element 11 is described here as an example.

The GMR element 11 has a spin-valve structure. As illustrated in FIG. 7A, the structure is formed by stacking a pinned layer 61, an intermediate layer 62, and a free layer 63 in order. The pinned layer 61 has the magnetization J61 pinned, for example, in +X-direction, the intermediate layer 62 does not have a specified magnetization, and the free layer 63 has a magnetization J63 which changes depending on the magnitude and the direction of the applied magnetic field such as the induced magnetic field Hm and the compensation magnetic field Hd. An axis of easy magnetization AE63 of the free layer 63 is preferably parallel to Y-axis. As illustrated in FIG. 5, the magnetization J61 of the GMR element 13 is pinned in the same direction (in +X-direction) as the magnetization J61 of the GMR element 11. In contrast, the magnetization J61 of each of the GMR elements 12 and 14 is pinned in opposite direction (in −X-direction) of the magnetization J61 of each of the GMR elements 11 and 13. FIG. 7A illustrates an unloaded state in which the induced magnetic field Hm or the compensation magnetic field Hd is not applied (namely, a state in which the external magnetic field is zero). In this case, the direction of the magnetization J63 of the free layer 63 is parallel to the axis of easy magnetization AE63 thereof, and is substantially orthogonal to the magnetization J61 of the pinned layer 61.

The free layer 63 is made of a soft magnetic material such as nickel iron alloy (NiFe). The intermediate layer 62 is made of copper (Cu), the top surface thereof is in contact with the pinned layer 61, and the bottom surface thereof is in contact with the free layer 63. The intermediate layer 62 may be made of a nonmagnetic metal with high conductivity such as gold (Au) besides copper. The intermediate layer 62 also functions as a path line through which large part of read currents I1 and I2 (described later) supplied at the time of operation of the current sensor flows. Note that the bottom surface of the free layer 63 (surface opposite to the surface contacting the intermediate layer 62) may be protected by a protection film which is not illustrated in the figure. Moreover, an exchange bias magnetic field Hin in the same direction as the magnetization direction J61 (hereinafter, simply referred to as "exchange bias magnetic field Hin") is generated between the pinned layer 61 and the free layer 63, and the pinned layer 61 and the free layer 63 are magnetically interacted with each other through the intermediate layer 62. The intensity of the exchange bias magnetic field Hin is changed by the rotation of the spin direction of the free layer 63 depending on the relative distance between the pinned layer 61 and the free layer 63 (namely, the thickness of the intermediate layer 62). Therefore, the exchange bias magnetic field. Hin may be regarded as zero apparently. FIG. 7A illustrates the configuration example in the case where the free layer 63, the intermediate layer 62, and the pinned layer 61 are stacked in order from the lower side, but the configuration is not limited thereto, and may be configured in the opposite order.

FIG. 7B illustrates a detailed configuration of the pinned layer 61. The pinned layer 61 has a configuration in which, for example, a magnetization pinned film 64, an antiferromagnetic film 65, and a protection film 66 are stacked in order from the intermediate layer 62 side. The magnetization pinned film 64 is made of a ferromagnetic material such as cobalt (Co) and cobalt iron alloy (CoFe). The direction of the magnetization indicated by the magnetization pinned film 64 becomes the direction of the magnetization J61 of the entire pinned layer 61. On the other hand, the antiferromagnetic film 65 is made of an antiferromagnetic material such as platinum manganese alloy (PtMn) and iridium manganese alloy (IrMn). The antiferromagnetic film 65 is in a state where a spin magnetic moment in +X-direction and a spin magnetic moment in the opposite direction (−X-direction) are completely canceled, and acts to pin the direction of the magnetization of the magnetization pinned film 64 (namely, the direction of the magnetization 361 of the pinned layer 61). The protection film 66 is made of nonmagnetic material which is relatively chemically stable, for example, tantalum (Ta) and hafnium (Hf), and protects the magnetization pinned film 64 and the antiferromagnetic film 65.

In the GMR elements 11 to 14 with the above described structure, the magnetization J63 of the free layer 63 is rotated by the application of a synthetic magnetic field of the induced magnetic field Hm and the compensation magnetic field Hd, and therefore the relative angle of the magnetization J63 to the magnetization J61 is changed. The relative angle is determined depending on the magnitude and the direction of the induced magnetic field Hm and the compensation magnetic field Hd. The direction of the induced magnetic field Hm is in +X-direction and the direction of the compensation magnetic field Hd is −X-direction. However, since the induced magnetic field Hm normally has the intensity larger than that of the compensation magnetic field Hd, the direction of the synthetic magnetic field is in +X-direction. Accordingly, the magnetization J63 of the free layer 63 of each of the GMR elements 11 to 14 is tilted in +X-direction from the unloaded state illustrated in FIG. 7A, and the resistance value of each of the GMR elements 11 to 14 increases or decreases. More specifically, since the magnetization J61 of each of the GMR elements 11 and 13 is in +X-direction, when the synthetic magnetic field of the induced magnetic field Hm and the compensation magnetic field Hd is applied, the magnetization J63 is close to the state parallel to the magnetization J61, and thus the resistance value thereof decreases. On the other hand, since the magnetization J61 of each of the GMR elements 12 and 14 is in −X-direction, the synthetic magnetic field of the induced magnetic field Hm and the compensation magnetic field Hd is applied, the magnetization J63 is close to the state antiparallel to the magnetization J61, and thus the resistance value increases.

Method of Detecting Current-to-be-Detected by Current Sensor

There is described the method of determining the current-to-be-detected Im by measuring the induced magnetic field Hm with use of the current sensor of the embodiment.

In FIG. 5, the state where the induced magnetic field Hm and the compensation magnetic field Hd are not applied is considered. The resistance value of each of the GMR elements 11 to 14 at the time of application of the read current I0 from the power source Vcc is r1 to r4. The read current I0 from the power source Vcc is divided into a read current I1 and a read current I2 at the junction P1. After that, the read current I1 passed through the GMR elements 11 and 14, and the read current I2 passed through the GMR elements 12 and 13 are converged at the junction P2. In this case, the potential difference V between the junction P1 and the junction P2 is expressed by an equation (1).

$$V = I1 \times r4 + I1 \times r1 \quad (1)$$
$$= I2 \times r3 + I2 \times r2$$
$$= I1(r4 + r1)$$
$$= I2(r3 + r2)$$

In addition, a potential V1 at the third junction P3 and a potential V2 at the fourth junction P4 are expressed by following equations.

$$V1 = V - V4$$
$$= V - I1 \times r4$$
$$V2 = V - V3$$
$$= V - I2 \times r3$$

Therefore, the potential difference V0 between the third junction P3 and the fourth junction P4 is expressed by an equation (2).

$$V0 = V2 - V1 \quad (2)$$
$$= (V - I2 \times r3) - (V - I1 \times r4)$$
$$= I1 \times r4 - I2 \times r3$$

Here, from the equation (1), the equation (3) is established.

$$V0 = r4/(r4 + r1) \times V - r3/(r3 + r2) \times V \quad (3)$$
$$= \{r4/(r4 + r1) - r3/(r3 + r2)\} \times V$$

In the bridge circuit, by measuring the voltage V0 between the junction P3 and the junction P4 expressed by the equation (3) at the time of application of the induced magnetic field Hm, the resistance change amount is obtained. It is assumed that the resistance values r1 to r4 are increased by the change amounts ΔR1 to ΔR4 at the time of application of the induced magnetic field Hm, that is, the resistance values R1 to R4 at the time of application of the induced magnetic field Hm are expressed by following equations.

$$R1 = r1 + \Delta R1$$

$$R2 = r2 + \Delta R2$$

$$R3 = r3 + \Delta R3$$

$$R4 = r4 + \Delta R4$$

As a result, from the equation (3), the potential difference V0 at the time of application of the induced magnetic field Hm satisfies the equation (4)

$$V0\{(r4+\Delta R4)/(r4+\Delta R4+r1+\Delta R1)+(r3+\Delta R3)/(r3+\Delta R3+r2+\Delta R2)\} \times V \quad (4)$$

As described above, in the current sensor, the resistance values R1 and R3 of the GMR elements 11 and 13 and the resistance values R2 and R4 of the GMR elements 12 and 14 change in the opposite direction to each other. Consequently, the change amount ΔR3 and the change amount ΔR2 are canceled to each other as well as the change amount ΔR4 and the change amount ΔR1 are canceled to each other. Therefore, in the case where the comparison is made before and after the induced magnetic field Hm is applied, the increase of the denominator in each term of the equation (4) hardly occurs. On the other hand, for the numerator in each term, since a sign of the change amount ΔR3 is opposite to that of the change amount ΔR4 at any time, the values increase or decrease without canceling from each other. This is because, by application of the induced magnetic field Hm, the resistance value of each of the GMR elements 12 and 14 changes (substantially decreases) by the change amounts $\Delta R2$ and $\Delta R4$ ($\Delta R2$, $\Delta R4<0$), respectively while the resistance value of each of the GMR elements 11 and 13 changes (substantially increases) by the change amount $\Delta R1$ and $\Delta R3$ ($\Delta R1$, $\Delta R3>0$), respectively.

The magnitude of the induced magnetic field Hm may be measured by using the GMR elements 11 to 14 in which the relationship between the external magnetic field and the resistance change amount is known, and thus the magnitude of the current-to-be-detected Im generating the induced magnetic field Hm may be estimated.

Operation and Effects of Current Sensor

Figure 10:
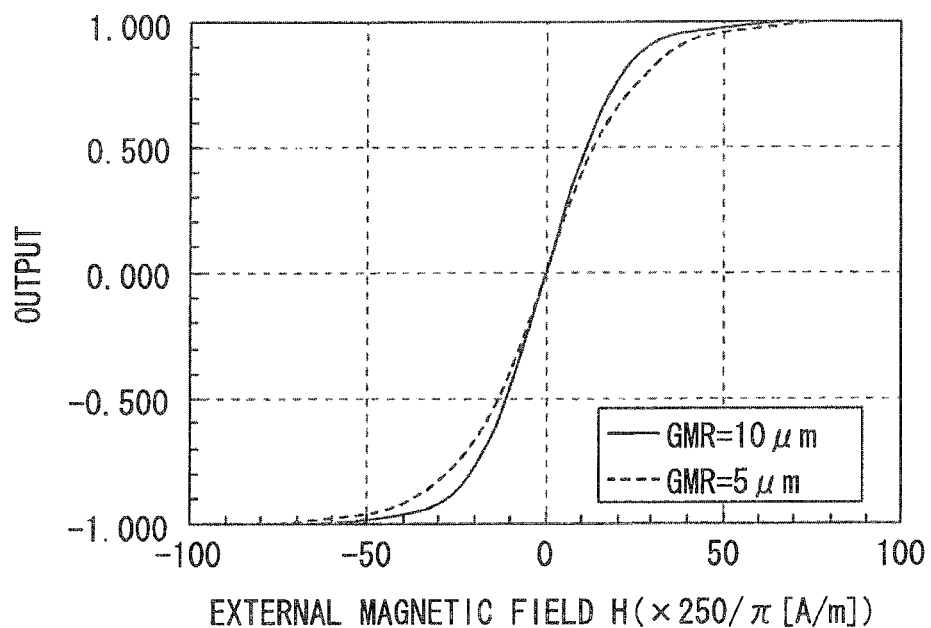
FIG. 10 is a characteristic diagram (measured values) illustrating a relationship between an external magnetic field and an output of the GMR element.

However, generally, the resistance values r1 to r4 and the change amounts $\Delta R1$ to $\Delta R4$ are different from one another due to the individual difference of the GMR elements 11 to 14. In addition, variation of the connection resistance or deviation of the temperature distribution in a circuit, or an external interference magnetic field is presence. Therefore, the potential difference V includes error components caused by the above described factors. Thus, in the current sensor, the error components of the potential difference V is eliminated with use of the compensation magnetic field Hd. Specifically, in the current sensor, the differential amplifier AMP is supplied with the potential V1 detected at the junction P3 and the potential V2 detected at the junction P4, and the differential amplifier AMP outputs the compensation current Id so that the difference (potential difference V0) between the potential V1 and the potential V2 is zero. The compensation current Id from the difference amplifier AMP flows through the line portions 31 to 34 disposed in the vicinity of the GMR elements 11 to 14 in the direction opposite to the direction of the current-to-be-detected Im, thereby generating the compensation magnetic field Hd in the opposite direction to the induced magnetic field Hm. The compensation magnetic field Hd acts to cancel the error components caused by variation of the connection resistance or variation of the characteristics between the GMR elements 11 to 14 in the circuit, deviation of the temperature distribution, or external interference magnetic field. As a result, the compensation current Id becomes closer to the magnitude proportional to only the induced magnetic field Hm. Accordingly, in the compensation current detection section S, the measurement of the output voltage Vout and the calculation of the compensation current Id from the relationship with the known resistor RL lead to determination of the induced magnetic field Hm with accuracy, and eventually, the magnitude of the current-to-be-detected Im may be established with high precision. In addition, as illustrated in FIG. 10, although the GMR elements 11 to 14 show nonlinearity with respect to the external magnetic field, the influence of the nonlinearity (error of the output) is canceled by forming such a feedback circuit (circuit for applying the compensation magnetic field Hd based on the output of the full-bridge circuit), and therefore the measurement with high precision is possible.

Further, the current sensor of the embodiment is configured so that the widths W31 to W34 of the line portions 31 to 34 in the compensation current line 30 are narrower than the widths W11 to W14 of the GMR elements 11 to 14, respectively. Consequently, the compensation magnetic field Hd may be effectively applied to the GMR elements 11 to 14 without wasting the compensation magnetic field Hd. In other words, the maximum intensity and the average intensity of the effective magnetic field which is actually applied to the GMR elements 11 to 14 are improved.

Figure 8A:
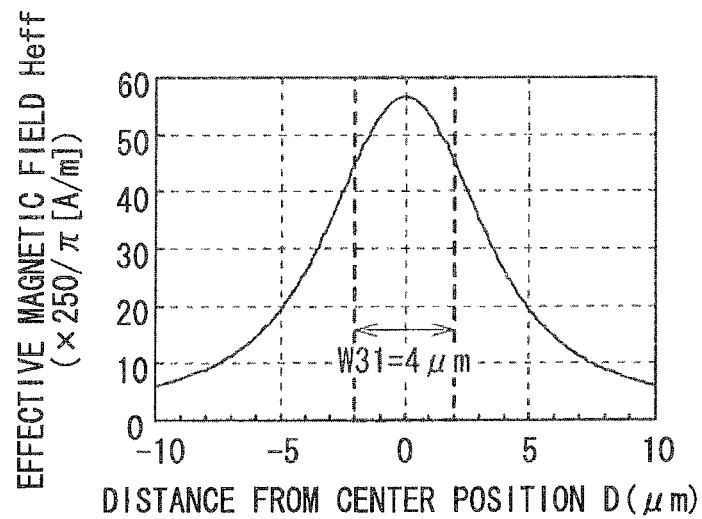
FIGS. 8A to 8C are characteristic diagrams illustrating a distribution in a width direction of an effective magnetic field of the GMR element applied from a line portion of the compensation current line.
Figure 8B:
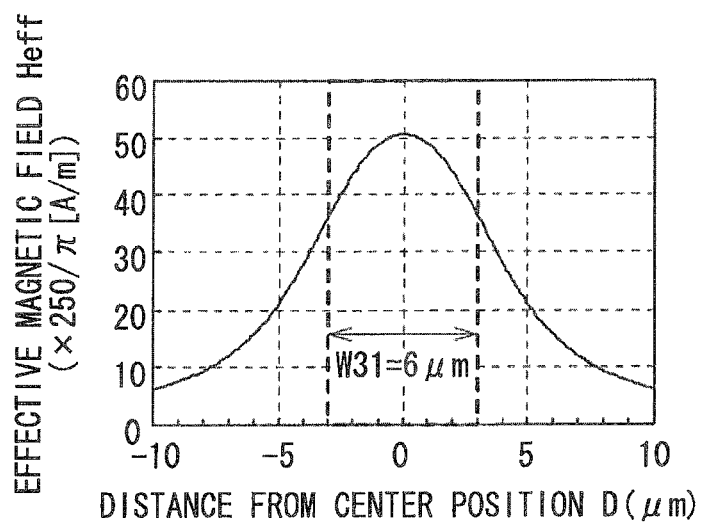
Figure 8C:
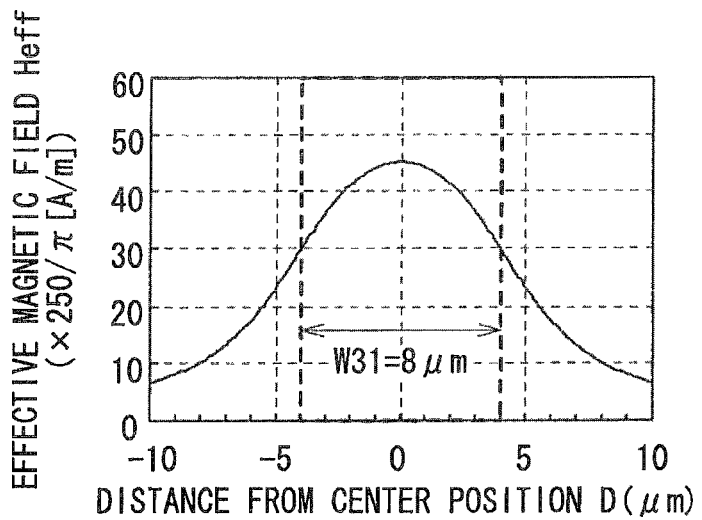

FIGS. 8A to 8C illustrate distribution in the width direction of the effective magnetic field applied to the GMR element 11 from the line portion 31 of the compensation current line 30. In FIGS. 8A to 8C, the horizontal axis indicates a distance D ($\mu$m) from a center position of the line portion 31 in the width direction (in X-axis direction), and the vertical axis indicates the intensity of the effective magnetic field Heff ($\times 250/\pi$ [A/m]). Here, the calculated values of the effective magnetic field Heff are illustrated, where the compensation current Id is 100 mA, the distance between the GMR element 11 and the line portion 31 in the thickness direction (in Z-axis direction) is 0.3 $\mu$m, and the thickness of the line portion 31 is 5.7 $\mu$m. In addition, FIGS. 8A to 8C correspond to the case where the width W31 of the line portion 31 is 4 $\mu$m, 6 $\mu$m, and 8 $\mu$m, respectively. As illustrated in FIGS. 8A to 8C, the intensity distribution of the effective magnetic field Heff shows a steep peak and the maximum intensity is increased, as the width W31 becomes narrower.

Figure 9:
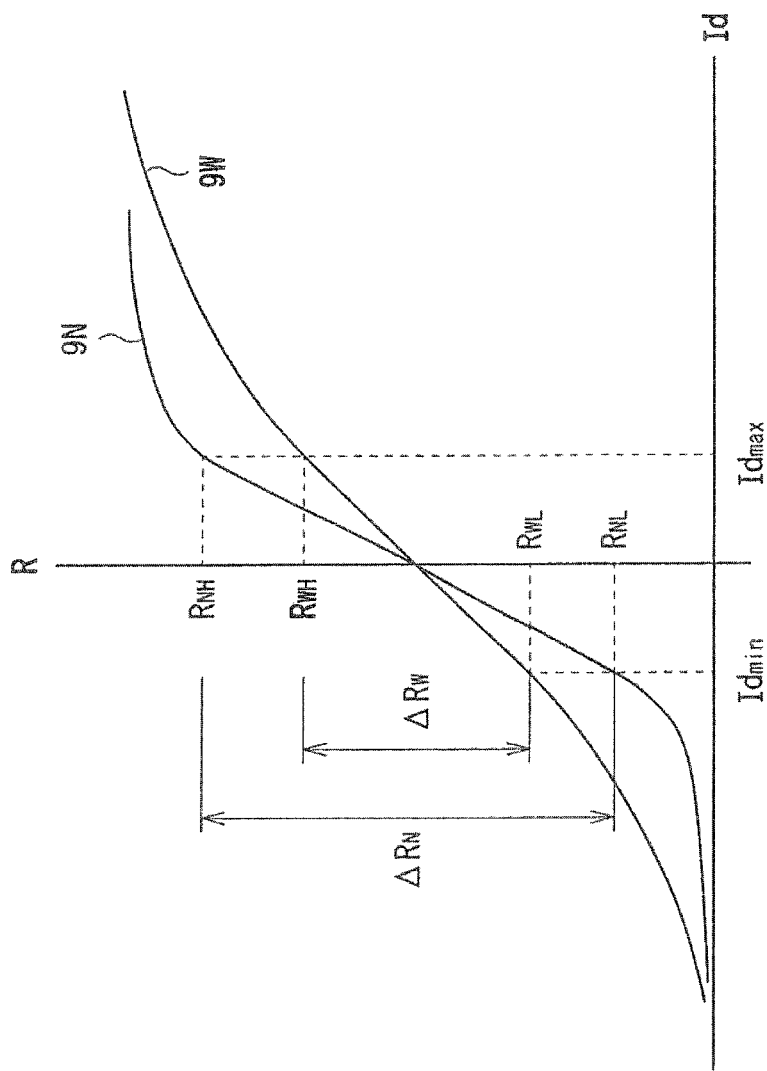
FIG. 9 is a conceptual diagram illustrating a relationship between a compensation current and a resistance value of the GMR element applied with the compensation magnetic field.

Accordingly, even if the compensation current Id flowing through the compensation current line 30 has a constant value, the narrower the width W31 of the line portion 31 is, the larger the effective magnetic field is applied to the GMR element 11. As a result, the resistance change amount $\Delta R$ of the GMR element 11 becomes large. About this matter, the description is given referring to FIG. 9. FIG. 9 is a conceptual diagram illustrating a relationship between the compensation current Id flowing through the line portion 31 and the resistance value R of the GMR element 11 applied with the compensation magnetic field Hd. In FIG. 9, the horizontal axis indicates the compensation current Id, and the vertical axis indicates the resistance value R. A curved line 9W indicates a case where the width W31 is relatively large (sample W), and a curved line 9N indicates a case where the width W31 is relatively small (sample N). In this case, for example, assuming that the compensation current Id increases to the maximum value Idmax, the resistance value of the sample W (the curved line 9W) increases to $R_{WH}$, whereas the resistance value of the sample N (the curved line 9N) increases to $R_{NH}$ ($>R_{WH}$). Assuming that the compensation current Id decreases to the minimum value Idmin, the resistance value of the sample W (the curved line 9W) decreases to $R_{WL}$, whereas the resistance value of the sample N (the curved line 9N) decreases to $R_{NL}$ ($=R_{WL}$). Therefore, when the compensation current Id changes from the minimum value Idmin to the maximum value Idmax, the resistance change amount $\Delta R_N$ ($=R_{NH}-R_{NL}$) obtained in the sample N is larger than the resistance change amount $\Delta R_W$ ($=R_{WH}-R_{WL}$) obtained in the sample W.

As described above, the narrower the widths W31 to W34 of the line portions 31 to 34 are, the more the compensation magnetic field Hd is effectively applied to the GMR elements 11 to 14. Therefore, in the case where the larger current-to-be-detected Im (the induced magnetic field Hm) is measured, the error components of the potential difference V may be sufficiently canceled. In other words, the effective magnetic field of the compensation magnetic field Hd necessary for measurement of the larger current-to-be-detected Im (the induced magnetic field Hm) may be secured without increasing the compensation current Id. Accordingly, the measurable range of the current-to-be-detected Im (the induced magnetic field Hm) in the current sensor may be enlarged.

As the example illustrated in FIG. 10, the output (the resistance value) of each of the GMR elements 11 to 14 is saturated by application of the external magnetic field having the intensity of a certain level or higher. In FIG. 10, the horizontal axis indicates the external magnetic field H ($\times 250/\pi$ [A/m]), and the vertical axis indicates the output (the magnitude of the voltage drop) standardized with the maximum value being 1.

A curved line 10W indicates a relationship between the external magnetic field H and the output in the case of each of the widths W11 to W14 being 10 µm, and a curved line 10N indicates a relationship between the external magnetic field H and the output in the case of each of the widths W11 to W14 being 5 µm. In this case, the free layer 63 has a two layer structure of NiFe layer with a thickness of 7 nm and CoFe layer with a thickness of 1 nm. Therefore, the total magnitude of the magnetic moment in the free layer 63 (product of the magnetic moment Ms per unit volume and the volume of the free layer 63) is $2.3 \times 10^6$ A/m. As illustrated in FIG. 10, in both cases of the curved line 10W and the curved line 10N, when the external magnetic field exceeds 50 ($\times 250/\pi$ [A/m]), the output is saturated (namely, the saturation magnetic field is $50 \times 250/\pi$ [A/m]). Accordingly, if the compensation magnetic field Hd with intensity exceeding the saturation magnetic field of the GMR elements 11 to 14 (here, the compensation magnetic field Hd exceeding $50 \times 250/\pi$ [A/m]) is applied, the free layer 63 has no more the magnetization J63 which rotates, and it is accordingly wasted. Therefore, the intensity of the compensation magnetic field Hd is set to be equal to or larger than a threshold value which allows the magnetization J63 of the free layer 63 included in each of the GMR elements 11 to 14 to rotate, and to be less than a saturation magnetic field of the free layer 63. By doing so, the compensation magnetic field Hd is appropriate in terms of the magnitude and the homogeneity in the width direction. Thus, the output change (resistance change) of the GMR elements 11 to 14 appropriately occurs. Incidentally, in FIG. 10, by applying the bias magnetic field Hb ($=60 \times 250/\pi$ [A/m]) having a predetermined magnitude with use of the permanent magnets HM1 and HM2, a remanent magnetization is hardly generated in the curved line 10W and the curved line 10N.

Figure 11:
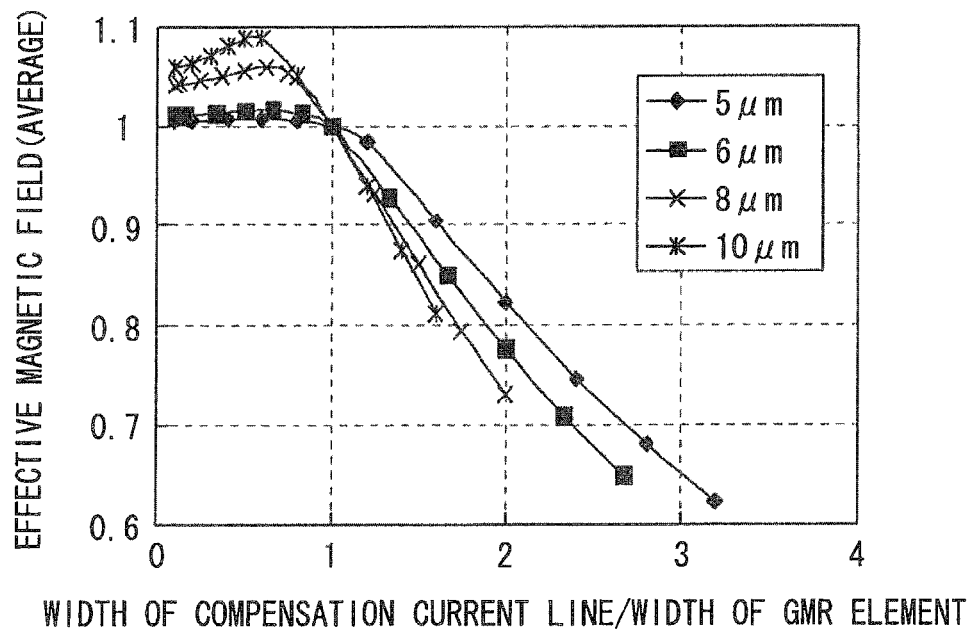
FIG. 11 is a characteristic diagram (calculated values) illustrating a relationship between average intensity of the effective magnetic field applied to the GMR element and a width ratio.

FIG. 11 is a characteristic diagram (calculated values) illustrating the relationship between the average intensity of the effective magnetic field out of the compensation magnetic field Hd which is applied to the GMR elements 11 to 14 and the ratio of the widths W31 to W34 to the widths W11 to W14 (hereinafter, referred to as width ratio). In FIG. 11, the horizontal axis indicates the width ratio, and the vertical axis indicates the effective magnetic field. In this case, the standardization is made on a basis of the width ratio being 1. As illustrated in FIG. 11, in the case where the width ratio is less than 1, the higher average intensity of the effective magnetic field is obtainable, compared with the case where the width radio is equal to or larger than 1. It is considered that when the widths W31 to W34 of the line portions 31 to 34 are wider than the widths W11 to W14 of the GMR elements 11 to 14, the generation portions of the compensation magnetic field Hd of the line portions 31 to 34 are dispersed in the width direction, and the components of the compensation magnetic field Hd at portions where the line portions 31 to 34 do not overlap the GMR elements 11 to 14 in the thickness direction are insufficiently reached to the GMR elements 11 to 14.

Figure 12:
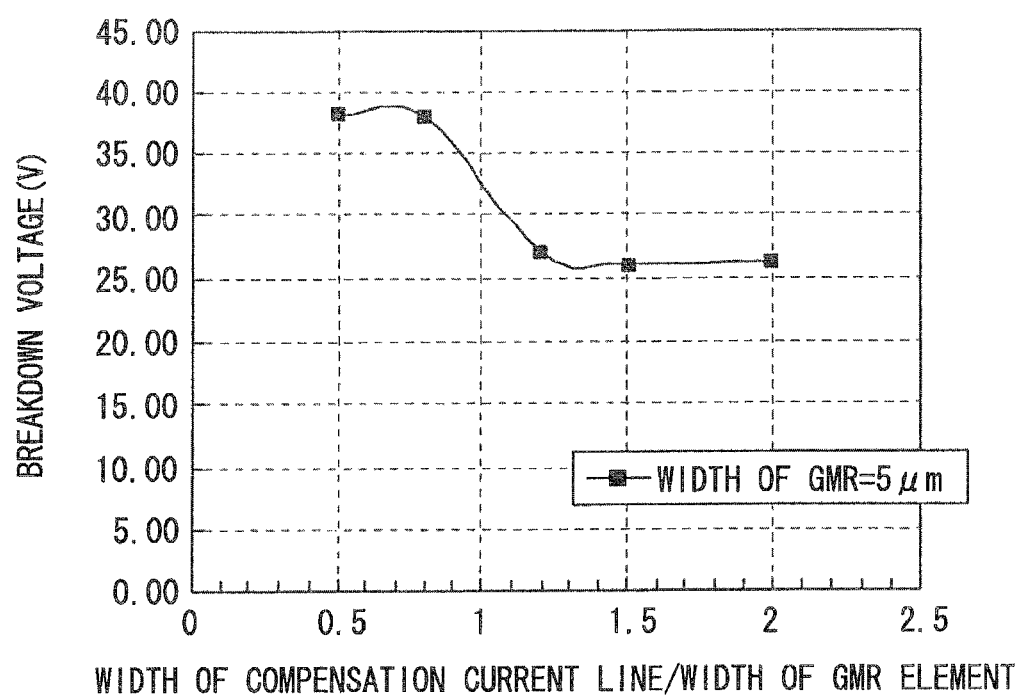
FIG. 12 is a characteristic diagram (measured values) illustrating a relationship between a breakdown voltage between the GMR element and the compensation current line, and a width ratio therebetween.

Moreover, in the embodiment, the widths W31 to W34 of the line portions 31 to 34 of the compensation current line 30 are narrower than the widths W11 to W14 of the GMR elements 11 to 14 which respectively overlap with the line portions 31 to 34. Therefore, the pressure resistance is improved. As an example, in FIG. 12, illustrated is a relationship (measured values) between the breakdown voltage and the width ratio (the width of the compensation current line/the width of the GMR element), the breakdown voltage causing an insulation breakdown between the GMR elements 11 to 14 and the compensation current line 30. As illustrated in FIG. 12, in the case where the width ratio is less than 1, the higher breakdown voltage is obtained, compared with the case where the width ratio exceeds 1. Incidentally, the GMR elements 11 to 14 and the compensation current line 30 are insulated by the insulation film with thickness of 300 nm made of alumina. In addition, the widths W11 to W14 each are 5 µm, and the widths W31 to W34 are changed in 5 levels, that is, 2.5, 0.8, 6.0, 7.5, and 10.0 µm.

In such a way, in the embodiment, since the compensation magnetic field Hd is effectively applied to the GMR elements 11 to 14 without wasting the compensation magnetic field Hd, the induced magnetic field may be detected with higher sensitivity and higher precision. In the related art, since the loss of the compensation magnetic field caused by the structure is relatively large, the compensation magnetic field with sufficient intensity is not applied to each of the magneto-resistive elements, and it is difficult to cancel the error components of the output voltage. However, according to the embodiment, the compensation magnetic field Hd with necessary and sufficient intensity may be applied to the GMR elements 11 to 14, and therefore the above described disadvantages are dissolved and the current-to-be-detected Im may be more accurately determined. Moreover, the current-to-be-detected Im over the wider range may be detected without increasing the compensation current Id. In addition, without increasing the distance between the line portions 31 to 34 and the GMR elements 11 to 14, the breakdown voltage therebetween may be improved and the higher pressure resistance may be obtained.

Second Embodiment

Figure 13A:
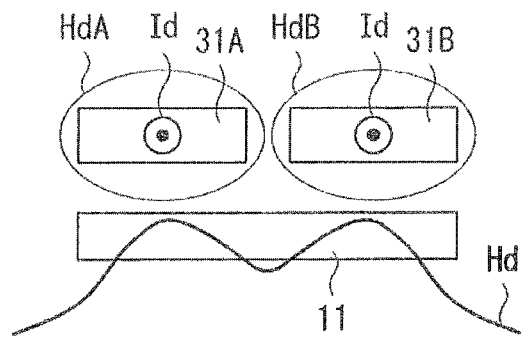
FIGS. 13A to 13C are enlarged schematic diagrams illustrating a configuration of a main part of a current sensor according to a second embodiment of the invention.

Next, a current sensor as a second embodiment of the invention will be described referring to FIG. 13A. FIG. 13A illustrates a sectional configuration of a main part (around a GMR element) of the current sensor of the embodiment, and corresponds to a part of FIG. 4A of the above described first embodiment. In FIG. 13A, although the line portion 31 and the GMR element 11 are exemplified, the other line portions 32 to 34 and the other GMR elements 12 to 14 have the same configuration as the line portion 31 and the GMR element 11. On this point, the same applied to FIGS. 13B and 13C which are described later.

As illustrated in FIG. 13A, in the current sensor of the embodiment, a plurality of line portions of the compensation current line is provided for one GMR element. Specifically, a line portion 31A and a line portion 31B are connected in series with each other, and disposed so as to overlap the GMR element 11 in the thickness direction. Since the line portion 31A and the line portion 31B are connected in series with each other, both are supplied with the compensation current Id, and then a compensation magnetic field HdA and a compensation magnetic field HdB are generated, respectively. At this time, the synthetic compensation magnetic field Hd obtained by synthesizing the compensation magnetic field HdA and the compensation magnetic field HdB shows a distribution in the width direction like a curved line illustrated in FIG. 13A. As a result, the GMR element 11 may be applied with the effective magnetic field which is more homogenized in the width direction without reducing the maximum intensity and the average intensity. Accordingly, it is expected to improve the detection accuracy and to expand the range of the current-to-be-detected. Note that although the line portion 31A and the line portion 31B are arranged in the same line with the same height (the position in Z-axis direction), may be arranged with the different height from each other.

Modification of Second Embodiment

Figure 13B:
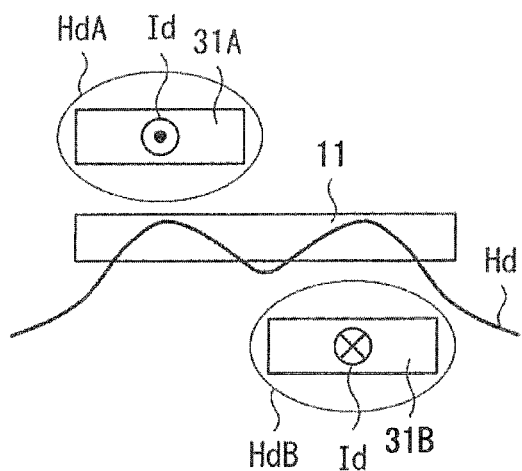
Figure 13C:
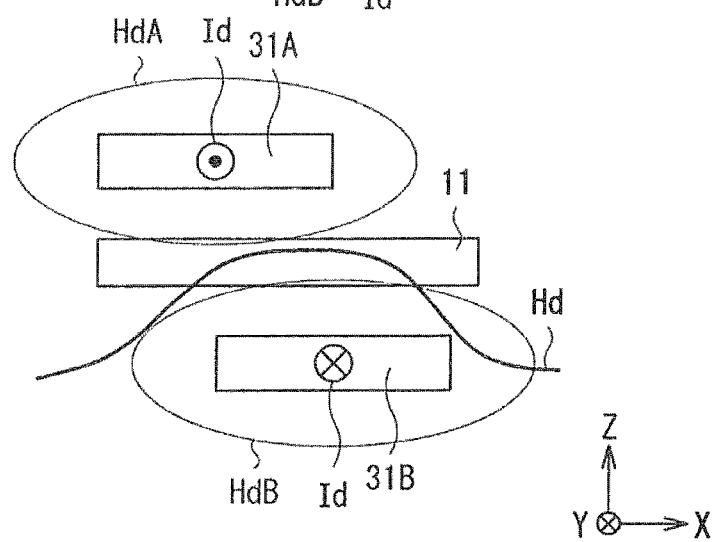

In addition, in the embodiment, as illustrated in FIG. 13B, a pair of the line portions 31A and 31B is arranged so as to sandwich the GMR element 11 in the thickness direction. In this case, the pair of the line portions 31A and 31B is preferably provided on the respective sides of the GMR element 11 so that the centers of the line portions 31A and 31B sandwich the center of the GMR element 11. This is because the GMR element 11 is applied with the effective magnetic field which is more homogenized in the width direction. In this case, as illustrated in FIG. 13C, for example, while the pair of the line portions 31A and 31B is arranged at the positions with the equivalent distance from the GMR element 11 in the thickness direction, the widths W31A and W31B of the line portions 31A and 31B may be extended. In other words, the pair of the line portions 31A and 31B has a positional relationship of overlapping portions with each other in the thickness direction. In this case, as illustrated in FIG. 13C, the synthetic compensation magnetic field Hd shows flatter distribution in the width direction, the more homogenized effective magnetic field is applied to the whole GMR element 11, and therefore the detection accuracy is advantageously improved.

Figure 14:
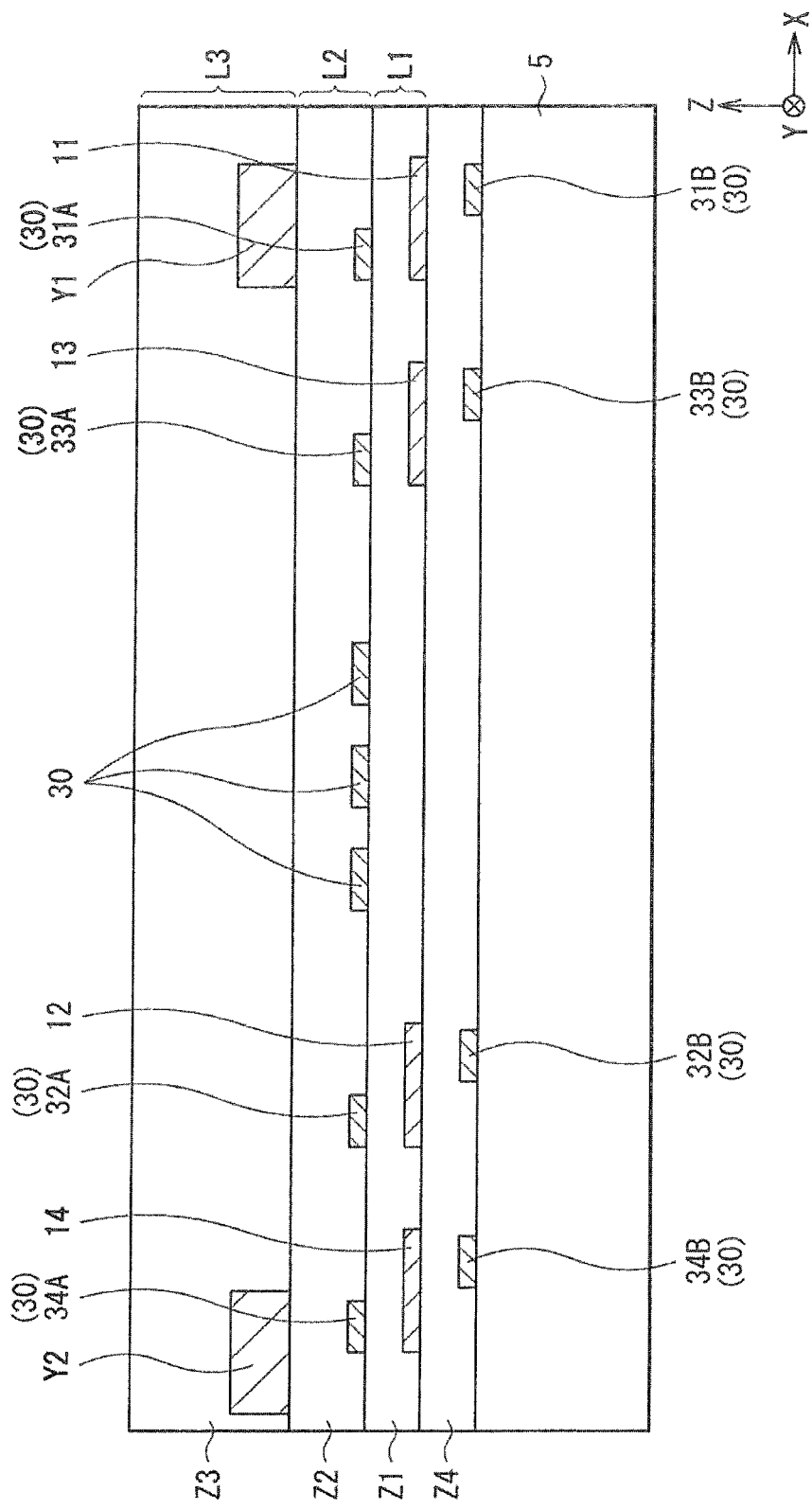
FIG. 14 is a sectional view illustrating the configuration of the main part of the current sensor according to the second embodiment.
Figure 15:
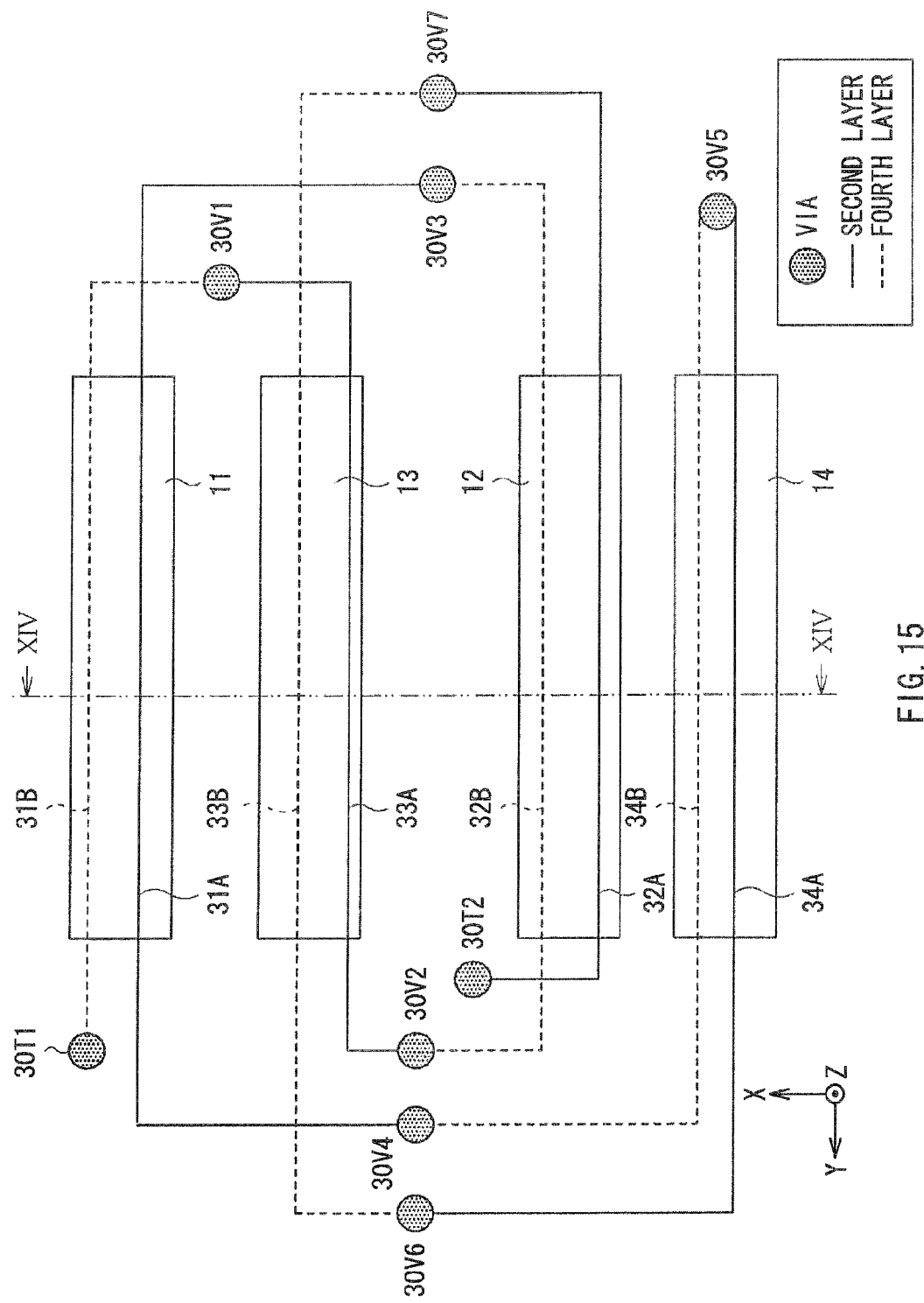
FIG. 15 is a conceptual diagram illustrating a layout of a compensation current line illustrated in FIG. 14.

FIG. 14 and FIG. 15 illustrate a configuration example of the compensation current line 30 corresponding to the configuration of FIG. 13A and FIG. 13B. FIG. 14 is a sectional view illustrating the whole configuration of the sensor unit 3 of the current sensor in the modification, and FIG. 15 is a top view thereof. FIG. 14 illustrates a section surface in the allow direction taken along a XIV-XIV line illustrated in FIG. 15. As illustrated in FIG. 14 and FIG. 15, in the modification, the line portions 31B, 32B, 33B, and 34B are provided in a fourth layer L4 inserted between the element substrate 5 and the first layer L1. The line portions 31B, 32B, 33B, and 34B are covered with the insulation film Z4, and configure the compensation current line 30 as one thin film conducting wire, together with line portions 31A, 32A, 33A, and 34A connected to one another through vias 30V1 to 30V7.

Note that although the example where two line portions of the compensation current line are provided for one GMR element is illustrated in FIGS. 13 to 15, three or more line portions may be provided for one GMR element.

Third Embodiment

Figure 16:
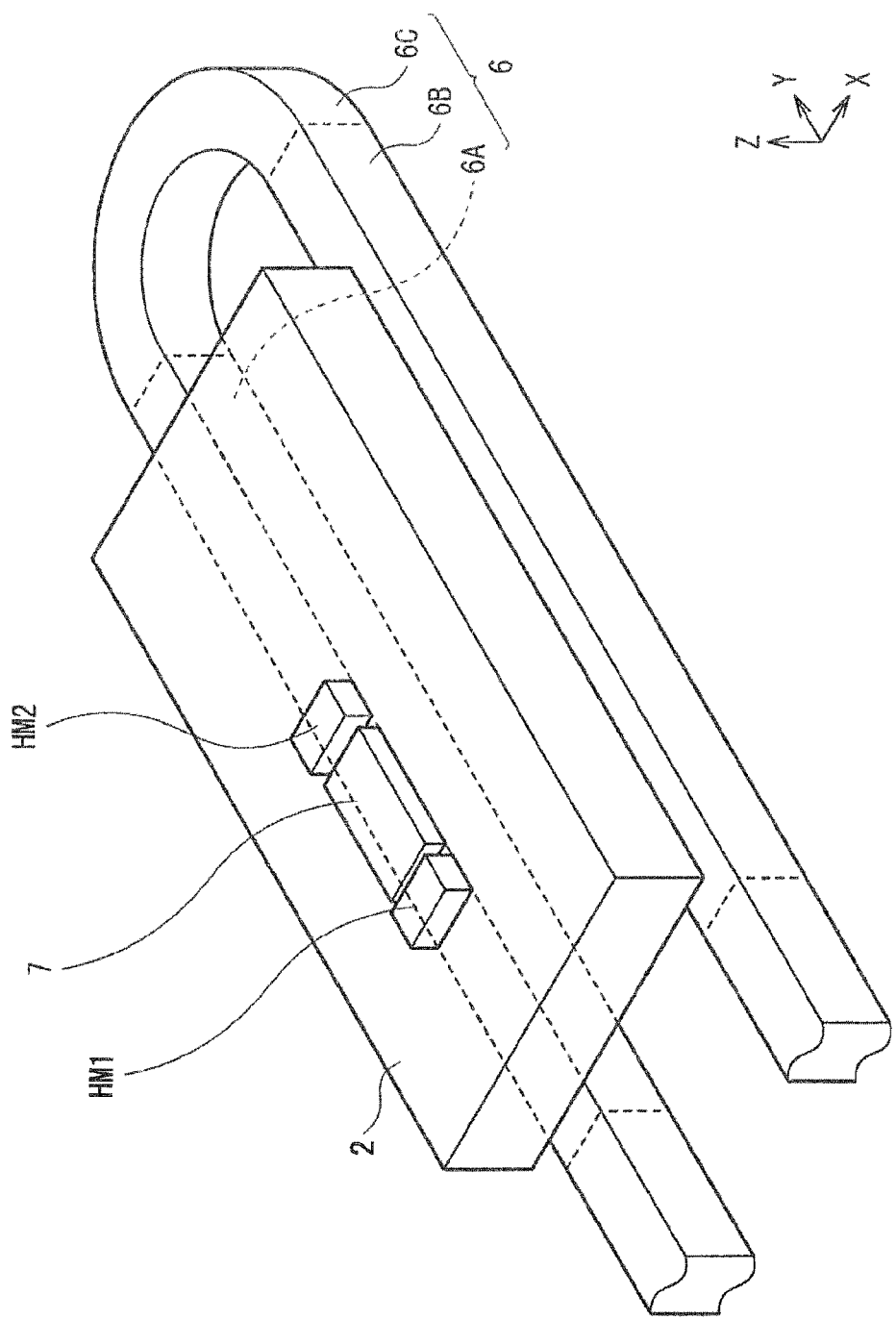
FIG. 16 is a perspective view illustrating a whole configuration of a current sensor according to a third embodiment of the invention.
Figure 17:
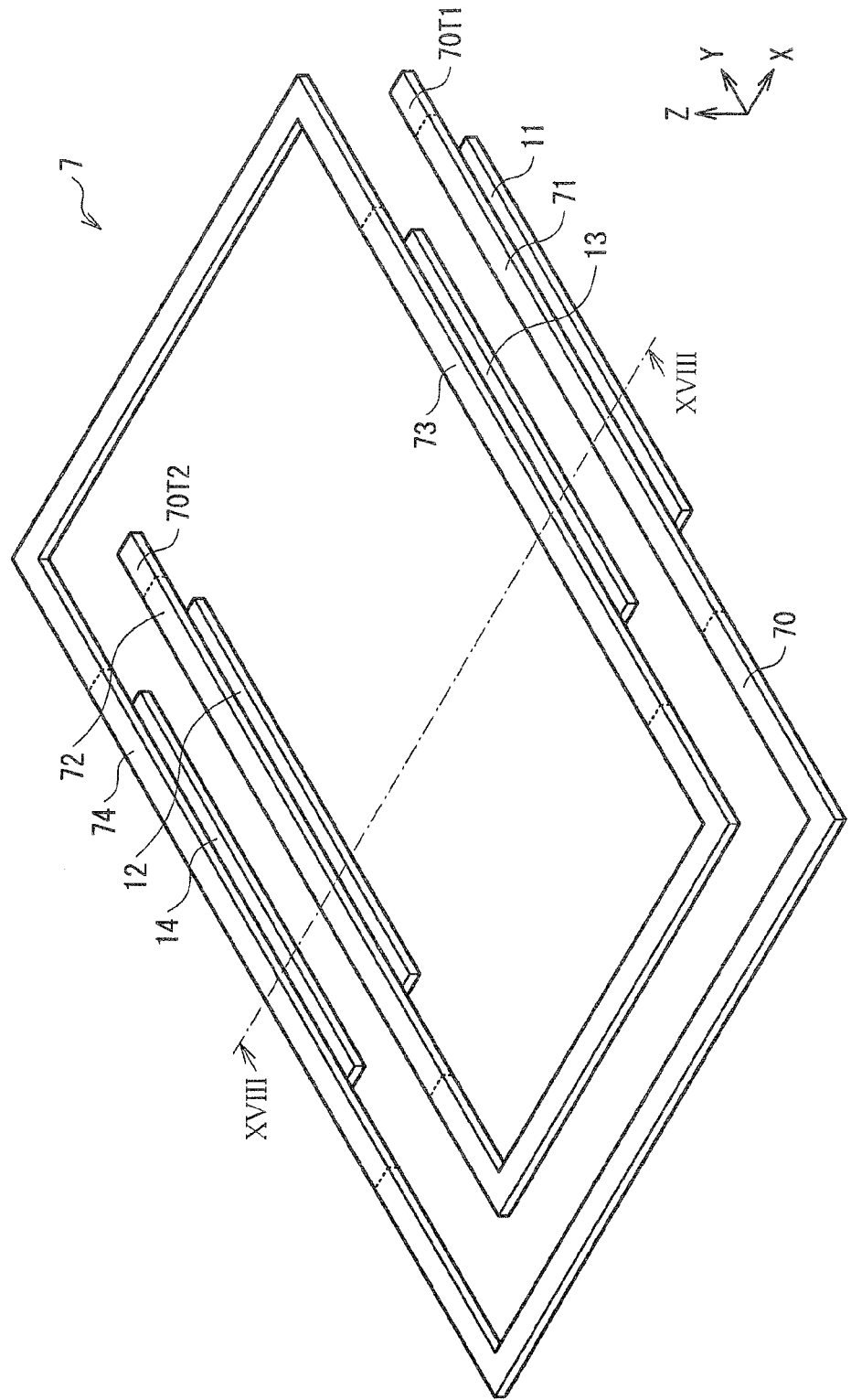
FIG. 17 is a perspective view illustrating a main part of a sensor unit illustrated in FIG. 16.
Figure 18:
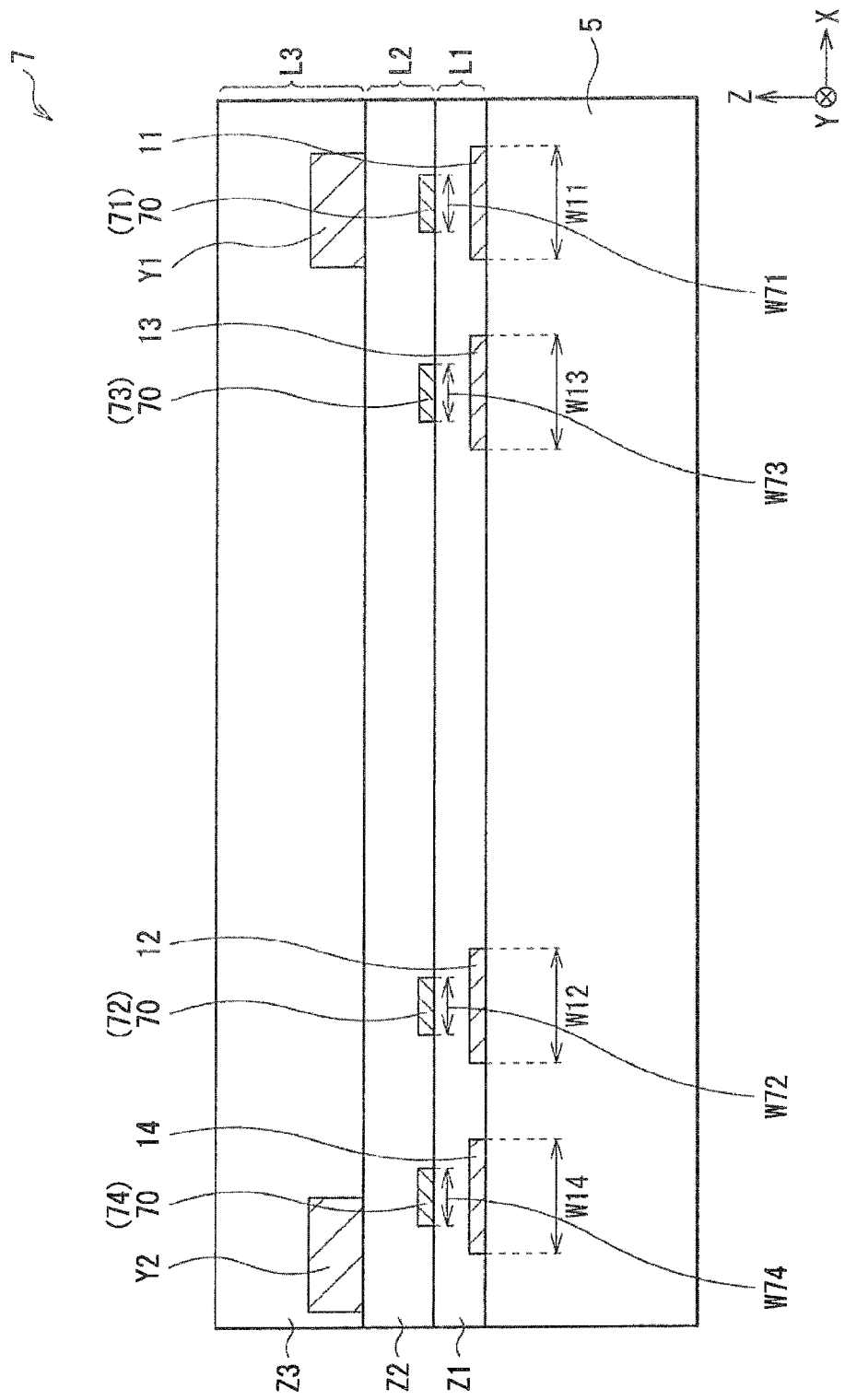
FIG. 18 is a sectional view illustrating a configuration of the sensor unit illustrated in FIG. 17, taken along a XVIII-XVIII line.

Next, a current sensor as a third embodiment of the invention will be described referring to FIGS. 16 to 19. In this embodiment, like reference numerals are utilized to indicate like components of the first embodiment described above, and the description thereof is appropriately omitted. FIG. 16 is a perspective view illustrating a whole configuration of a current sensor of the embodiment, and FIG. 17 is a perspective view illustrating a partial configuration of a sensor unit 7 which is a main part of the current sensor. FIG. 18 is a sectional view of the sensor unit 7 taken along a XVIII-XVIII line of FIG. 17, and FIG. 19 is a circuit diagram of the current sensor illustrated in FIG. 16.

As illustrated in FIG. 16, the current sensor includes a conductor 6 through which a current-to-be-detected Im (FIG. 19) flows, a substrate 2 arranged near the conductor 6, and the sensor unit 7 disposed on the substrate 2. The conductor 6 has a U-shaped structure as a whole, and has, for example, a pair of straight portions 6A and 6B, and a curved portion 6C. The pair of straight portions 6A and 6B is oppositely disposed parallel to each other in a XY plane and the curved portion 6C connects one end of the straight portion 6A and one end of the straight portion 6B. On the substrate 2, for example, a pair of permanent magnets HM1 and HM2 are mounted so as to sandwich the sensor unit 7 along an extending direction (in this case, Y-axis direction) of the straight portions 6A, and GB of the conductor 6. Although not illustrated in the figure, a tubular shield structure made of a magnetic material such as permalloy may be provided to surround the conductor 6 and the sensor unit 7 collectively. The sensor unit 7 is provided in a region between the straight portions 6A and 6B in X-axis direction on the substrate 2.

As illustrated in FIG. 17 and FIG. 18, the sensor unit 7 is formed by stacking in order, for example, on an element substrate 5 (not illustrated in FIG. 17), a first layer L1 provided with a detection circuit 80 including GMR elements 11 to 14, a second layer L2 including a compensation current line 70, and a third layer L3 (not illustrated in FIG. 17) including yokes Y1 and Y2.

Figure 19:
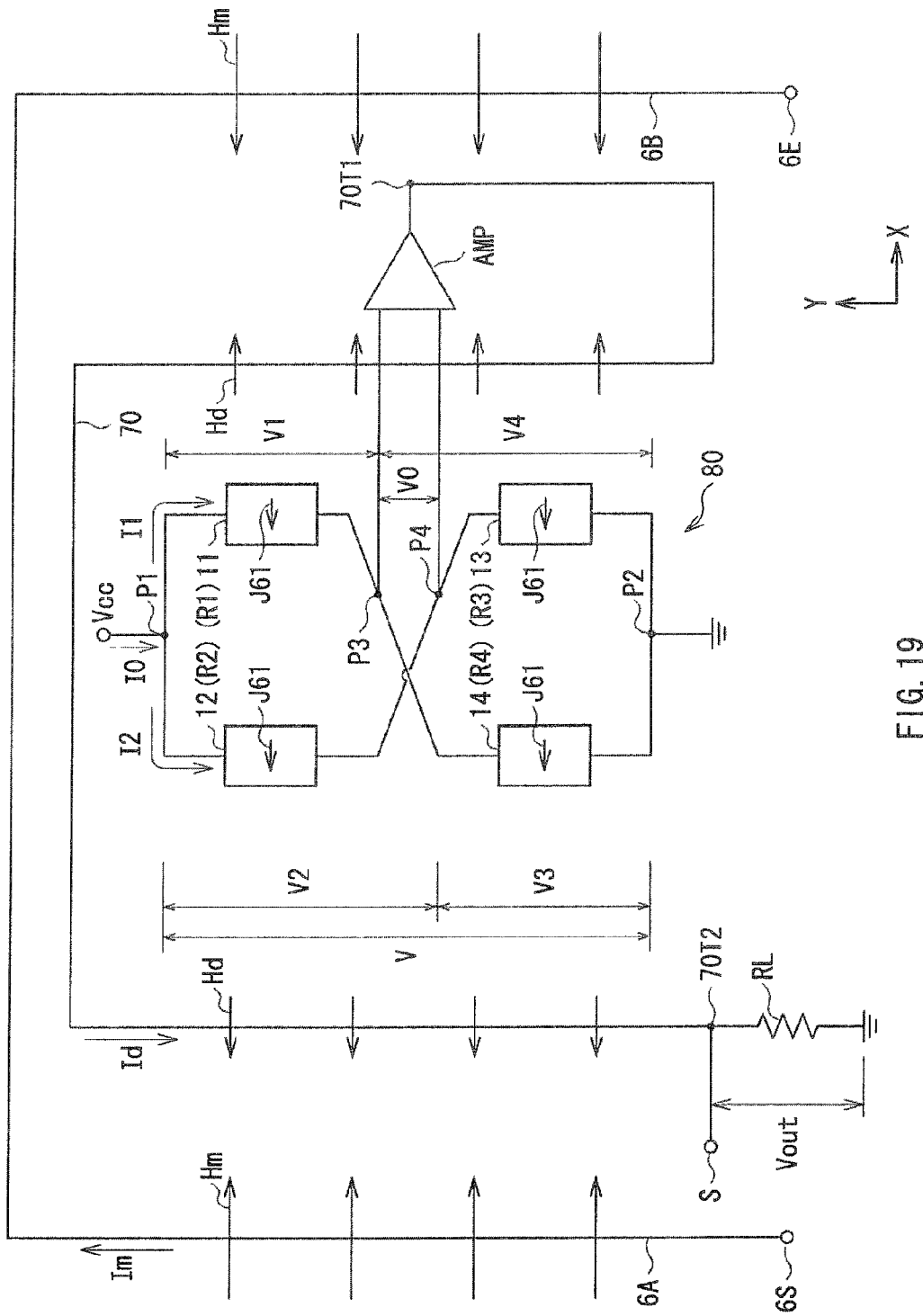
FIG. 19 is a circuit diagram of the current sensor illustrated in FIG. 16.

The detection circuit 80 is a bridge circuit in which the four GMR elements 11 to 14 are bridge-connected as illustrated in FIG. 19. The GMR elements 11 to 14 are band-shaped thin film patterns arranged along the straight portions 6A and 6B of the conductor 6, and each have a resistance value which changes depending on an induced magnetic field Um induced by the current-to-be-detected Im flowing through the conductor 6 from an end 6S toward an end 6E, for example. The GMR elements 11 and 13 are applied with the induced magnetic field Hm generated around the straight portion GB in −X-direction, and the GMR elements 12 and 14 are applied with the induced magnetic field Hm generated around the straight portion 6A in +X-direction. Each of the GMR elements 11 to 14 includes a pinned layer 61 having a magnetization J61 which is pinned in a direction illustrated by an arrow. Therefore, the resistance values of the GMR elements 11 and 13 change (increase or decrease) in the same direction depending, on the induced magnetic field Hm. On the other hand, the resistance values of the GMR elements 12 and 14 change (decrease or increase), depending on the induced magnetic field Hm, in the opposite direction to that of (the change of the resistance values of) the GMR elements 11 and 13. In other words, for example, in the case where the resistance values of the GMR elements 11 and 13 increase, the resistance values of the GMR elements 12 and 14 decrease.

The compensation current line 70 is made of a metal material with high conductivity such as copper, and is a thin film conducting wire in which a thin film is extended in a stacking plane. A part of the compensation current line 70 extends straight in an extending direction (here, in Y-axis-direction) of the straight portions 6A and 6B of the conductor 6, and includes a plurality of line portions 71 to 74 arranged parallel to each other in a width direction (in X-axis direction) orthogonal to the extending direction and the thickness direction (the stacking direction) of the straight portions 6A and 6B. As illustrated in FIG. 18, the line portions 71 to 74 have widths W71 to W74 in the width direction, respectively. The widths W71 to W74 may be equal to each other, or may be different from each other. One end 70T1 of the compensation current line 70 is connected to an output of a differential amplifier AMP and other end 70T2 is grounded through a resistor RL as illustrated in FIG. 19. The end 70T2 on the differential amplifier AMP side of the resistor RL is connected to a compensation current detection section S. Therefore, the compensation current line 70 is supplied with a compensation current Id based on a potential difference between a junction P3 and a junction P4 when a voltage is applied between a junction P1 and a junction P2. The compensation current line 70 has a path for applying the compensation magnetic field Hd to the GMR elements 11 to 14 at the time of flowing the compensation current Id. Here, the direction of the compensation magnetic field Hd generated in the line portions 71 to 74 is opposite to that of the induced magnetic field Hm generated by the current-to-be-detected Im flowing through the conductor 6. Specifically, when the induced magnetic field Hm is applied to the GMR elements 11 and 13 in −X-direction and the induced magnetic field Hm is applied to the GMR elements 12 and 14 in +X-direction, the compensation magnetic field Hd from the line portions 71 and 73 is applied to the GMR elements 11 and 13 in +X-direction and the compensation magnetic field Hd from the line portions 72 and 74 is applied to the GMR elements 12 and 14 in −X-direction.

The current sensor of the embodiment with such a configuration may provide similar effects to those of the current sensor according to the first embodiment.

Figure 20:
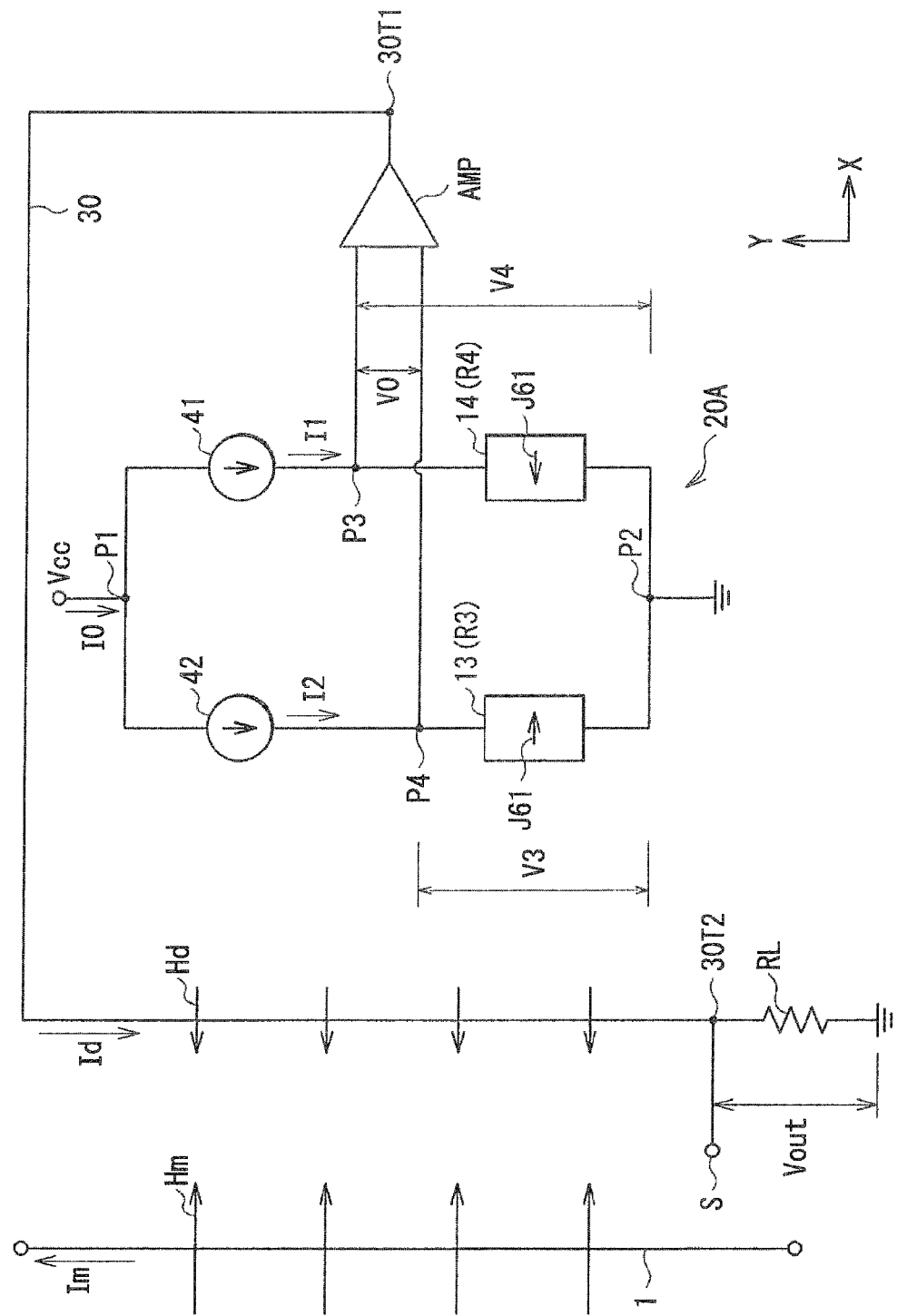
FIG. 20 is a circuit diagram of a current sensor as a first modification of the embodiments of the invention.
Figure 21:
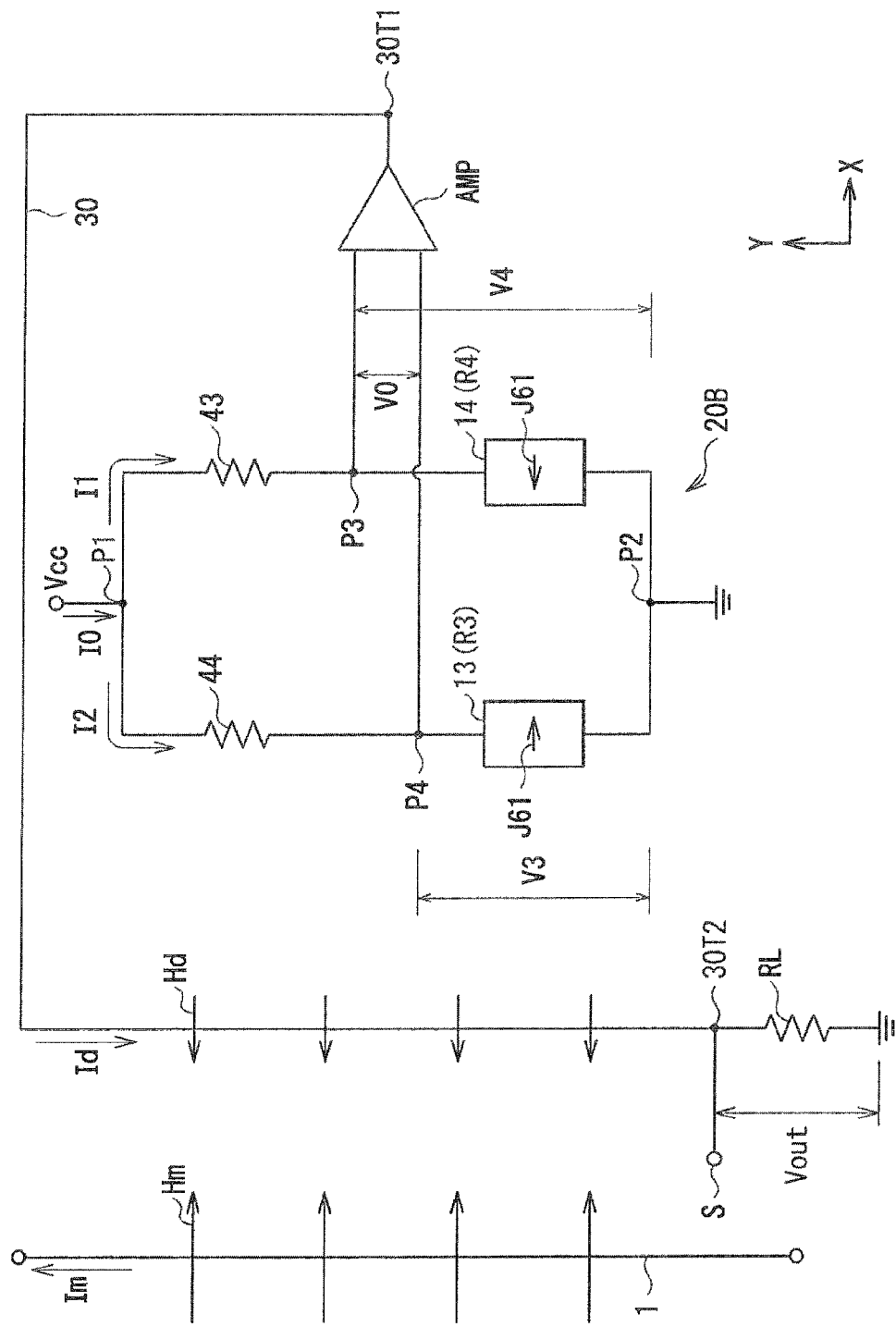
FIG. 21 is a circuit diagram of a current sensor as a second modification of the embodiments of the invention.

Although the present invention has been described with the embodiments and the modification, the present invention is not limited to the embodiments and the like, and various modifications may be made. For example, in the above described embodiment and the like, although the case where the detection of the current-to-be-detected is performed with use of the detection circuit including four GMR elements has been described, the invention is, not limited thereto. For example, as a first modification of the embodiments of the invention illustrated in FIG. 20, a detection circuit 20A in which the GMR elements 11 and 12 are replaced by constant current sources 41 and 42 may be used. Moreover, as a second modification of the invention illustrated in FIG. 21, a detection circuit 20B in which the GMR elements 11 and 12 are replaced by resistances 43 and 44 may be used.

In addition, in the above described embodiments and the like, although one GMR element is configured with one band pattern, one GMR element may be configured with a plurality of band patterns connected in parallel to each other. However, in this case, it is desired that the each of the line portions of the compensation current line are arranged to correspond to each of the band patterns of the GMR element, as well as the width of each of the line portions of the compensation current line is narrower than the width of each of the band patterns. By doing so, the GMR element is more effectively applied with the compensation magnetic field, and the sensitivity of the GMR element to the compensation magnetic field and the induced magnetic field is more improved.

In the above described embodiments and the like, a GMR element is exemplified as a magneto-resistive element. However, in the invention, an anisotropic magneto-resistive effect (AMR) element or a tunnel magneto-resistive effect (TMR) element may be used as a magneto-resistive element.

The present application contains subject matter related to that disclosed in Japanese Priority Patent Application JP 2010-063161 filed in the Japan Patent Office on Mar. 18, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A current sensor comprising:

first to fourth magneto-resistive elements extending together in one direction along a conductor and configuring a bridge circuit, the first and third magneto-resistive elements having resistance values which change together in one increasing/decreasing direction in response to the induced magnetic field generated by a current-to-be-detected flowing in the conductor, whereas the second and fourth magneto-resistive elements having resistance values which change together in other increasing/decreasing direction opposite to that of the first and third magneto-resistive elements in response to the induced magnetic field, the bridge circuit being so configured that one end of the first magneto-resistive element is connected to one end of the second magneto-resistive element at a first junction, one end of the third magneto-resistive element is connected to one end of the fourth magneto-resistive element at a second junction, other end of the first magneto-resistive element is connected to other end of the fourth magneto-resistive element at a third junction, and other end of the second magneto-resistive element is connected to other end of the third magneto-resistive element at a fourth junction; and a compensation current line including one or more first line portions corresponding to the first magneto-resistive element, one or more second line portions corresponding to the second magneto-resistive element, one or more third line portions corresponding to the third magneto-resistive element, and one or more fourth line portions corresponding to the fourth magneto-resistive element, each line portion having a width smaller than that of corresponding one of the first to fourth magneto-resistive elements and extending in a direction same as the extending direction of the first to fourth magneto-resistive elements to overlap corresponding one of the first to fourth magneto-resistive elements, the compensation current line allowing a compensation current, which is generated in accordance with a potential difference between the first and second junctions in response to application of voltage between the third and fourth junctions, to flow therein to generate a compensation magnetic field which is directed, at each of the first to fourth magneto-resistive elements, to a direction opposite to that of the induced magnetic field and is applied to the first to fourth magneto-resistive elements, wherein the current-to-be-detected is detected based on the compensation current.

2. The current sensor according to claim 1, wherein intensity of the compensation magnetic field is equal to or larger than a threshold value which allows a magnetization of a free layer to rotate, and is less than a saturation magnetic field of the free layer, the free layer being included in each of the first to fourth magneto-resistive elements.

3. The current sensor according to claim 1, wherein a plurality of first line portions are provided corresponding to the first magneto-resistive element, a plurality of second line portions are provided corresponding to the second magneto-resistive element, a plurality of third line portions are provided corresponding to the third magneto-resistive element, and a plurality of fourth line portions are provided corresponding to the fourth magneto-resistive element.

4. The current sensor according to claim 3, wherein a pair of the first line portions, a pair of the second line portions, a pair of the third line portions, and a pair of the fourth line portions are arranged so as to sandwich the first to fourth magneto-resistive elements in a thickness direction, respectively.

5. The current sensor according to claim 4, wherein the pair of the first line portions is provided on respective sides of the first magneto-resistive element so that the centers of the first line portions are respectively shifted from the center of the first magnet-resistive element in directions opposite from each other along a width direction, the pair of the second line portions is provided on respective sides of the second magneto-resistive element so that the centers of the first line portions are respectively shifted from the center of the second magnet-resistive element in directions opposite from each other along a width direction, the pair of the third line portions is provided on respective sides of the third magneto-resistive element so that the centers of the third line portions are respectively shifted from the center of the third magnet-resistive element in directions opposite from each other along a width direction, and the pair of the fourth line portions is provided on respective sides of the fourth magneto-resistive element so that the centers of the fourth line portions are respectively shifted from the center of the fourth magnet-resistive element in directions opposite from each other along a width direction.

6. The current sensor according to claim 1, wherein the first to fourth magneto-resistive elements each have a stacked structure including a pinned layer, an intermediate layer, and the free layer in order, the pinned layer having a magnetization direction pinned in a certain direction, the free layer having a magnetization direction which changes depending on an external magnetic field.

7. The current sensor according to claim 6, further comprising one or more bias application members applying a bias magnetic field to the stacked structure in a direction orthogonal to the magnetization direction of the pinned layer.

8. The current sensor according to claim 6, wherein the magnetization direction of the pinned layer is orthogonal to the extending direction of the conductor and the first to fourth line portions.

9. The current sensor according to claim 1, further comprising yokes arranged away from the first to fourth magneto-resistive elements to extend along the extending direction of the magneto-resistive elements.

10. A current sensor comprising:

first and second magneto-resistive elements each extending along a conductor, and each having resistance values which change in directions opposite from each other in response to an induced magnetic field generated by a current-to-be-detected flowing in the conductor; and a compensation current line including one or more first line portions corresponding to the first magneto-resistive element, one or more second line portions corresponding to the second magneto-resistive element, each line portion having a width smaller than that of corresponding one of the first and second magneto-resistive elements and extending in a direction same as the extending direction of the first and second magneto-resistive elements to overlap corresponding one of the first and second magneto-resistive elements, the compensation current line allowing a compensation current, which is generated in accordance with a difference between a voltage drop generated in the first magneto-resistive element and a voltage drop generated in the second magneto-resistive element by a supply of a read current, to flow therein to generate a compensation magnetic field which is directed, at each of the first and second magneto-resistive elements, to a direction opposite to that of the induced magnetic field and is applied to the first and second magneto-resistive elements, wherein the current-to-be-detected is detected based on the compensation current.

11. The current sensor according to claim 10, further comprising a first constant current source and a second constant current source supplying the first and the second magneto-resistive elements with the read currents of the same magnitude, respectively.

12. The current sensor according to claim 11, wherein one end of the first magneto-resistive element is connected to one end of the second magneto-resistive element at a first junction, one end of the first constant current source is connected to one end of the second constant current source at a second junction, other end of the first magneto-resistive element is connected to other end of the first constant current source at a third junction, other end of the second magneto-resistive element is connected to other end of the second constant current source at a fourth junction, and the current-to-be-detected is detected based on a potential difference between the third junction and the fourth junction in response to application of voltage between the first and second junction.

\* \* \* \* \*